US011985906B2

(12) United States Patent
Yin et al.

(10) Patent No.: US 11,985,906 B2
(45) Date of Patent: May 14, 2024

(54) LOW-RESISTANCE CONTACT TO TOP ELECTRODES FOR MEMORY CELLS AND METHODS FOR FORMING THE SAME

(71) Applicant: Taiwan Semiconductor Manufacturing Company Limited, Hsinchu (TW)

(72) Inventors: Yu-Feng Yin, Hsinchu County (TW); Tai-Yen Peng, Hsinchu (TW); An-Shen Chang, Jubei (TW); Han-Ting Tsai, Kaoshiung (TW); Qiang Fu, Hsinchu (TW); Chung-Te Lin, Taiwan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 438 days.

(21) Appl. No.: 17/199,626

(22) Filed: Mar. 12, 2021

(65) Prior Publication Data

US 2021/0376231 A1    Dec. 2, 2021

Related U.S. Application Data

(60) Provisional application No. 63/031,711, filed on May 29, 2020.

(51) Int. Cl.
  *H10N 50/01* (2023.01)
  *H10B 61/00* (2023.01)
  (Continued)

(52) U.S. Cl.
  CPC ............ *H10N 50/10* (2023.02); *H10B 61/22* (2023.02); *H10N 50/01* (2023.02); *H10N 50/80* (2023.02); *H10N 50/85* (2023.02)

(58) Field of Classification Search
  CPC ........ H10N 50/10; H10N 50/80; H10N 50/01; H10N 50/85; H10B 61/22
  See application file for complete search history.

(56) References Cited

U.S. PATENT DOCUMENTS 9,070,869 B2    6/2015    Jung et al.
9,318,696 B2    4/2016    Lu et al.
(Continued)

FOREIGN PATENT DOCUMENTS

DE    102019115296 A1    3/2020
DE    102019109855 A1    4/2020
(Continued)

OTHER PUBLICATIONS

Taiwan Patent and Trademark Office, Application No. 110118640 Office Action, dated Jul. 20, 2022, 4 pages.
(Continued)

*Primary Examiner* — Ali Naraghi
*Assistant Examiner* — Siangluai Mang
(74) *Attorney, Agent, or Firm* — The Marbury Law Group, PLLC

(57) ABSTRACT

A magnetic tunnel junction (MTJ) memory cell and a metallic etch mask portion are formed over a substrate. At least one dielectric etch stop layer is deposited over the metallic etch mask portion, and a via-level dielectric layer is deposited over the at least one dielectric etch stop layer. A via cavity may be etched through the via-level dielectric layer, and a top surface of the at least one dielectric etch stop layer is physically exposed. The via cavity may be vertically extended by removing portions of the at least one dielectric etch stop layer and the metallic etch mask portion. A contact via structure is formed directly on a top surface of the top electrode in the via cavity to provide a low-resistance contact to the top electrode.

20 Claims, 25 Drawing Sheets

(51) Int. Cl.
  *H10N 50/10* (2023.01)
  *H10N 50/80* (2023.01)
  *H10N 50/85* (2023.01)

(56) References Cited

U.S. PATENT DOCUMENTS

| | | | |
|---|---|---|---|
| 9,431,609 B2 | 8/2016 | Dang et al. | |
| 10,008,662 B2 | 6/2018 | You et al. | |
| 10,529,919 B2 | 1/2020 | Cho et al. | |
| 2010/0327248 A1 | 12/2010 | Khoueir et al. | |
| 2013/0119494 A1* | 5/2013 | Li | H10N 50/10 257/E43.001 |
| 2015/0029779 A1* | 1/2015 | Lee | H10N 70/841 257/421 |
| 2016/0218283 A1 | 7/2016 | Trinh et al. | |
| 2019/0067559 A1* | 2/2019 | Chang | H10N 50/10 |
| 2019/0074440 A1* | 3/2019 | Yang | H10N 70/20 |
| 2019/0088864 A1* | 3/2019 | Cho | H10B 61/20 |
| 2019/0157344 A1* | 5/2019 | Wei | H10N 50/10 |
| 2019/0386210 A1* | 12/2019 | Rizzolo | H10N 50/80 |
| 2021/0020828 A1* | 1/2021 | Wang | H10N 50/01 |

FOREIGN PATENT DOCUMENTS

| | | |
|---|---|---|
| JP | 2005-524238 A | 8/2005 |
| JP | 20130065755 A | 4/2013 |
| KR | 20170001558 U | 1/2017 |
| KR | 20200037058 A | 4/2020 |
| TW | 201143180 A | 12/2011 |
| TW | 202008625 A | 2/2020 |

OTHER PUBLICATIONS

Korean Patent and Trademark Office, Application No. 10-2021-0060029; Second Office Action, dated Jul. 12, 2023, 4 pages.

Korean Patent and Trademark Office, Application No. 10-2021-0060029 filed May 10, 2021; Office Action, dated Nov. 21, 2022, 8 pages.

Office Action received from the German (Federal Republic of Germany) Patent Office in related Application No. 11020211068215, dated Feb. 27, 2023; 9 pages.

Korean Patent and Trademark Office, Application No. 10-2021-0060029; Notice of Final Rejection, dated Oct. 31, 2023, 8 pages.

Korean Patent and Trademark Office, Application No. 10-2024-0013457; Office Action mailed Mar. 6, 2024; 18 pages.

* cited by examiner

LOW-RESISTANCE CONTACT TO TOP ELECTRODES FOR MEMORY CELLS AND METHODS FOR FORMING THE SAME

RELATED APPLICATIONS

This application claims priority to U.S. Provisional Patent Application No. 63/031,711 entitled "Low-resistance Contact to Top Electrodes for Memory Cells and Methods for Forming the Same" filed on May 29, 2020, the entire contents of which are hereby incorporated by reference for all purposes.

BACKGROUND

Magnetic tunnel junction (MTJ) device consist of two layers of ferromagnetic materials separated by a thin insulating or dielectric layer. By providing an insulating layer or dielectric layer that is thin enough (typically a few nanometers), electrons may tunnel from one ferromagnetic layer through the insulating/dielectric layer into the other ferromagnetic layer. The direction of the two magnetizations of the ferromagnetic layers may individually controlled by an external magnetic field. If the magnetizations are in a parallel orientation, the electrons will tunnel through the insulating/dielectric layer. If the magnetizations are in the oppositional (antiparallel) orientation, the electrons will not tunnel through the insulating/dielectric layer. Consequently, such a junction device may be switched between two states of electrical resistance, one with low and one with very high resistance. These two states allow the MTJ device to act as a memory cell. Electrodes of a MTJ memory cell in a back-end-of-line level may be electrically connected to a front-end-of-line level driver circuit through metal interconnect structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
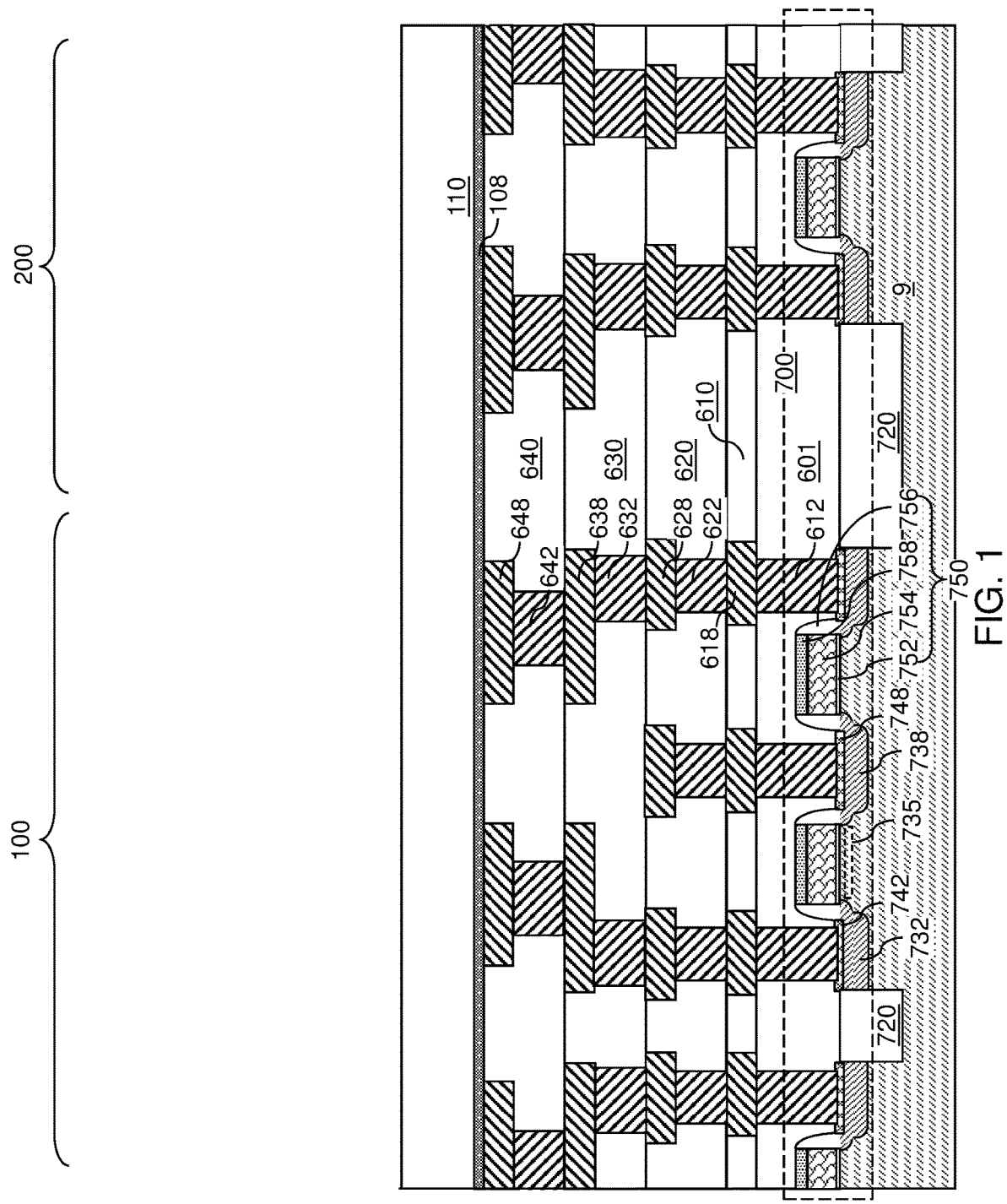
FIG. 1 is a vertical cross-sectional view of an exemplary structure after formation of complementary metal-oxide-semiconductor (CMOS) transistors and metal interconnect structures formed in dielectric material layers according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some types of semiconductor memory cells such as magnetic tunnel junction memory cells use top electrodes including an etch-resistant metallic material such as a metallic nitride material. Such etch-resistant metallic materials tend to have high resistivity and increase contact resistance to the memory cells. Generally, the structures and methods of the present disclosure may be used to form a memory cell and/or an array of memory cells. Specifically, the structures and methods of the present disclosure may be used to form a magnetic tunnel junction memory cell and/or an array of magnetic tunnel junction memory cells. While the present disclosure is described using an exemplary structure including magnetic tunnel junction memory cells, the methods of the present disclosure may be used to form any memory cell or any array of memory cells including a vertical stack of patterned material portions that constitutes a memory cell and containing a top electrode.

Integrated circuit and discrete device designs seek to minimize the size, power consumption while maximizing speed and performance. As device dimensions grow increasingly smaller, it becomes difficult to form a contact via structure on a memory cell without electrical shorts (i.e., unintended electrical connection of structures and nodes). In many embodiments, a contact via structure may have a lateral dimension that is greater than a lateral dimension of a top electrode of a memory cell. In embodiments that utilize magnetic tunnel junction memory cells, a metallic etch mask portion overlying a top electrode may be used as an etch mask for patterning various layers within the memory cell. For example, a conductive metallic nitride material such as TiN, TaN, or WN may be used as an etch mask material for patterning various material layers within a magnetic tunnel junction memory cell. While being effective as an etch mask material, such a conductive metallic nitride material has a higher resistivity than elemental metals such as W, Co, Cu, Mo, or Ru. As a result, such metallic etch mask portions may interfere or provide undesired resistance at an electrode site. Embodiments of the present disclosure provide removal of metallic etch mask portions after patterning memory cells, and prior to formation of contact via structures. Thus, contact via structures may directly contact top electrodes of the memory cells, and low resistance contact between the top electrodes and the contact via structures may be provided. Further, the contact via structures of the present disclosure may be self-aligned to underlying top electrodes, thereby reducing and/or avoiding undesirable electrical connection between the contact via structures and components of memory cells underlying the top electrodes. The various aspects of embodiments of the present disclosure are now described with reference to the drawings.

It is to be understood that the memory devices according to embodiments of the present disclosure may comprise a single discrete memory cell, a one-dimensional array of memory cells, or a two-dimensional array of memory cells. It is also to be understood that a one-dimensional array of memory cells of the present disclosure may be implemented as a periodic one-dimensional array of memory cells, and a two-dimensional array of memory cells of the present disclosure may be implemented as a periodic two-dimensional array of memory cells. In addition, while present disclosure is described using an embodiment in which a two-dimensional array of memory cells is formed within a specific metal interconnect level, embodiments are expressly contemplated herein in which the two-dimensional array of memory cells is formed within different metal interconnect levels.

Referring to FIG. 1, an exemplary structure according to an embodiment of the present disclosure is illustrated. FIG. 1 is a vertical cross-sectional view of an exemplary structure after formation of complementary metal-oxide-semiconductor (CMOS) transistors and metal interconnect structures formed in dielectric material layers according to an embodiment of the present disclosure. The exemplary structure includes a substrate 9, which may be a semiconductor substrate such as a commercially available silicon substrate. Shallow trench isolation structures 720 including a dielectric material such as silicon oxide may be formed in an upper portion of the substrate 9. Suitable doped semiconductor wells, such as p-type wells and n-type wells, may be formed within each area that is laterally enclosed by a portion of the shallow trench isolation structures 720. Field effect transistors may be formed over the top surface of the substrate 9. For example, each field effect transistor may include a source region 732, a drain region 738, a semiconductor channel 735 that includes a surface portion of the substrate 9 extending between the source region 732 and the drain region 738, and a gate structure 750. Each gate structure 750 may include a gate dielectric 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738.

The exemplary structure may include a memory array region 100 in which an array of memory elements is subsequently formed, and a logic region 200 in which logic devices that support operation of the array of memory elements are formed. In one embodiment, devices (such as field effect transistors) in the memory array region 100 may include bottom electrode access transistors that provide access to bottom electrodes of memory cells to be subsequently formed. Top electrode access transistors that provide access to top electrodes of memory cells to be subsequently formed may be formed in the logic region 200 at this processing step. Devices (such as field effect transistors) in the logic region 200 may provide functions that are needed to operate the array of memory cells to be subsequently formed. Specifically, devices in the logic region may be configured to control the programming operation, the erase operation, and the sensing (read) operation of the array of memory cells. For example, the devices in the logic region may include a sensing circuitry and/or a top electrode bias circuitry. The devices formed on the top surface of the substrate 9 may include complementary metal-oxide-semiconductor (CMOS) transistors and optionally additional semiconductor devices (such as resistors, diodes, capacitors, etc.), and are collectively referred to as CMOS circuitry 700.

Various metal interconnect structures formed in dielectric material layers may be subsequently formed over the substrate 9 and the devices (such as field effect transistors). The dielectric material layers may include, for example, a contact-level dielectric material layer 601, a first metal-line-level dielectric material layer 610, a second line-and-via-level dielectric material layer 620, a third line-and-via-level dielectric material layer 630, and a fourth line-and-via-level dielectric material layer 640. The metal interconnect structures may include device contact via structures 612 formed in the contact-level dielectric material layer 601 and contact a respective component of the CMOS circuitry 700, first metal line structures 618 formed in the first metal-line-level dielectric material layer 610, first metal via structures 622 formed in a lower portion of the second line-and-via-level dielectric material layer 620, second metal line structures 628 formed in an upper portion of the second line-and-via-level dielectric material layer 620, second metal via structures 632 formed in a lower portion of the third line-and-via-level dielectric material layer 630, third metal line structures 638 formed in an upper portion of the third line-and-via-level dielectric material layer 630, third metal via structures 642 formed in a lower portion of the fourth line-and- via-level dielectric material layer 640, and fourth metal line structures 648 formed in an upper portion of the fourth line-and-via-level dielectric material layer 640. In one embodiment, the second metal line structures 628 may include source lines that are connected to a source-side power supply for an array of memory elements. The voltage provided by the source lines may be applied to the bottom electrodes through the access transistors provided in the memory array region 100.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 648) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable materials within the contemplated scope of disclosure may also be used. In one embodiment, the first metal via structures 622 and the second metal line structures 628 may be formed as integrated line and via structures by a dual damascene process, the second metal via structures 632 and the third metal line structures 638 may be formed as integrated line and via structures, and/or the third metal via structures 642 and the fourth metal line structures 648 may be formed as integrated line and via structures. While the present disclosure is described using an embodiment in which an array of memory cells is formed over the fourth line-and-via-level dielectric material layer 640, embodiments are expressly contemplated herein in which the array of memory cells may be formed at a different metal interconnect level.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 648) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable materials within the contemplated scope of disclosure may also be used. In one embodiment, the first metal via structures 622 and the second metal line structures 628 may be formed as integrated line and via structures by a dual damascene process, the second metal via structures 632 and the third metal line structures 638 may be formed as integrated line and via structures, and/or the third metal via structures 642 and the fourth metal line structures 648 may be formed as integrated line and via structures. While the present disclosure is described using an embodiment in which an array of memory cells formed over the fourth line-and-via-level dielectric material layer 640, embodiments are expressly contemplated herein in which the array of memory cells may be formed at a different metal interconnect level.

A dielectric cap layer 108 and a connection-via-level dielectric layer 110 may be sequentially formed over the metal interconnect structures and the dielectric material layers. For example, the dielectric cap layer 108 may be formed on the top surfaces of the fourth metal line structures 648 and on the top surface of the fourth line-and-via-level dielectric material layer 640. The dielectric cap layer 108 includes a dielectric capping material that may protect underlying metal interconnect structures such as the fourth metal line structures 648. In one embodiment, the dielectric cap layer 108 may include a material that may provide high etch resistance, i.e., a dielectric material and also may function as an etch stop material during a subsequent anisotropic etch process that etches the connection-via-level dielectric layer 110. For example, the dielectric cap layer 108 may include silicon carbide or silicon nitride, and may have a thickness in a range from 5 nm to 30 nm, although lesser and greater thicknesses may also be used.

The connection-via-level dielectric layer 110 may include any material that may be used for the dielectric material layers (601, 610, 620, 630, 640). For example, the connection-via-level dielectric layer 110 may include undoped silicate glass or a doped silicate glass deposited by decomposition of tetraethylorthosilicate (TEOS). The thickness of the connection-via-level dielectric layer 110 may be in a range from 50 nm to 200 nm, although lesser and greater thicknesses may also be used. The dielectric cap layer 108 and the connection-via-level dielectric layer 110 may be formed as planar blanket (unpatterned) layers having a respective planar top surface and a respective planar bottom surface that extend throughout the memory array region 100 and the logic region 200.

Figure 2:
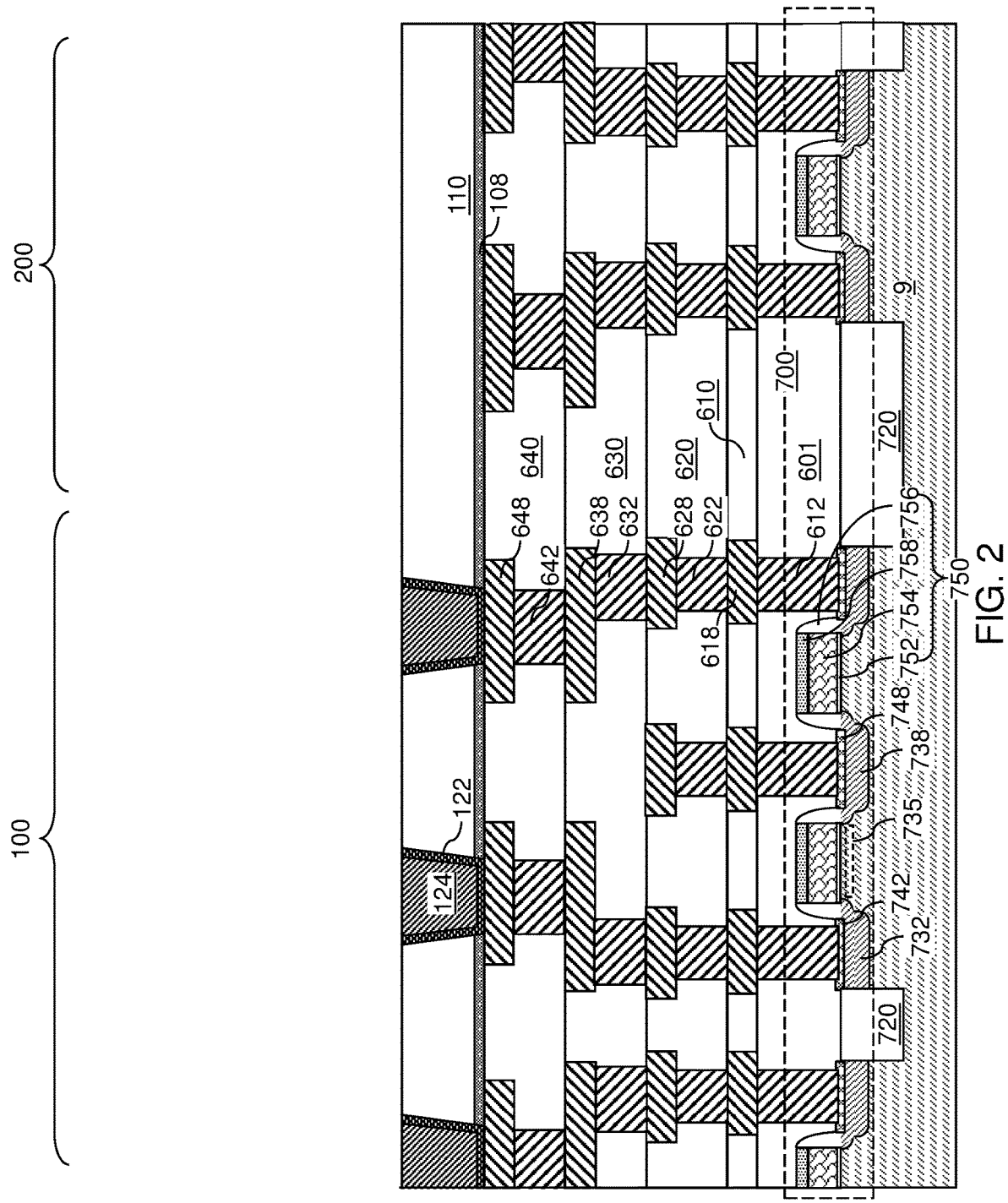
FIG. 2 is a vertical cross-sectional view of the exemplary structure after formation of an array of connection via structures according to an embodiment of the present disclosure.

FIG. 2 is a vertical cross-sectional view of the exemplary structure after formation of an array of connection via structures according to an embodiment of the present disclosure. Referring to FIG. 2, via cavities may be formed through the connection-via-level dielectric layer 110 and the dielectric cap layer 108. For example, a photoresist layer (not shown) may be applied over the connection-via-level dielectric layer 110 and may be patterned to form opening within areas of the memory array region 100 that overlie a respective one of the fourth metal line structures 648. An anisotropic etch may be performed to transfer the pattern in the photoresist layer through the connection-via-level dielectric layer 110 and the dielectric cap layer 108. The via cavities formed by the anisotropic etch process are herein referred to as lower-electrode-contact via cavities because bottom electrode connection via structures are subsequently formed in the lower-electrode-contact via cavities. The lower-electrode-contact via cavities may have tapered sidewalls having a taper angle (with respect to a vertical direction) in a range from 1 degree to 10 degrees. A top surface of a fourth metal line structure 648 may be physically exposed at the bottom of each lower-electrode-contact via cavity. The photoresist layer may be subsequently removed, for example, by ashing.

A metallic barrier layer may be formed as a material layer. The metallic barrier layer may cover physically exposed top surfaces of the fourth metal line structures 648, tapered sidewalls of the lower-electrode-contact via cavities, and the top surface of the connection-via-level dielectric layer 110 without any hole therethrough. The metallic barrier layer may include a conductive metallic nitride such as TiN, TaN, and/or WN. Other suitable materials within the contemplated scope of disclosure may also be used. The thickness of the metallic barrier layer may be in a range from 3 nm to 20 nm, although lesser and greater thicknesses may also be used.

A metallic fill material such as tungsten or copper may be deposited in remaining volumes of the lower-electrode-contact via cavities. Portions of the metallic fill material and the metallic barrier layer that overlie the horizontal plane including the topmost surface of the connection-via-level dielectric layer 110 may be removed by a planarization process such as chemical mechanical planarization. Each remaining portion of the metallic fill material located in a respective via cavity comprises a metallic via fill material portion 124. Each remaining portion of the metallic barrier layer in a respective via cavity comprises a metallic barrier layer 122. Each combination of a metallic barrier layer 122 and a metallic via fill material portion 124 that fills a via cavity constitutes a connection via structure (122, 124). An array of connection via structures (122, 124) may be formed in the connection-via-level dielectric layer 110 on underlying metal interconnect structures.

Figure 3:
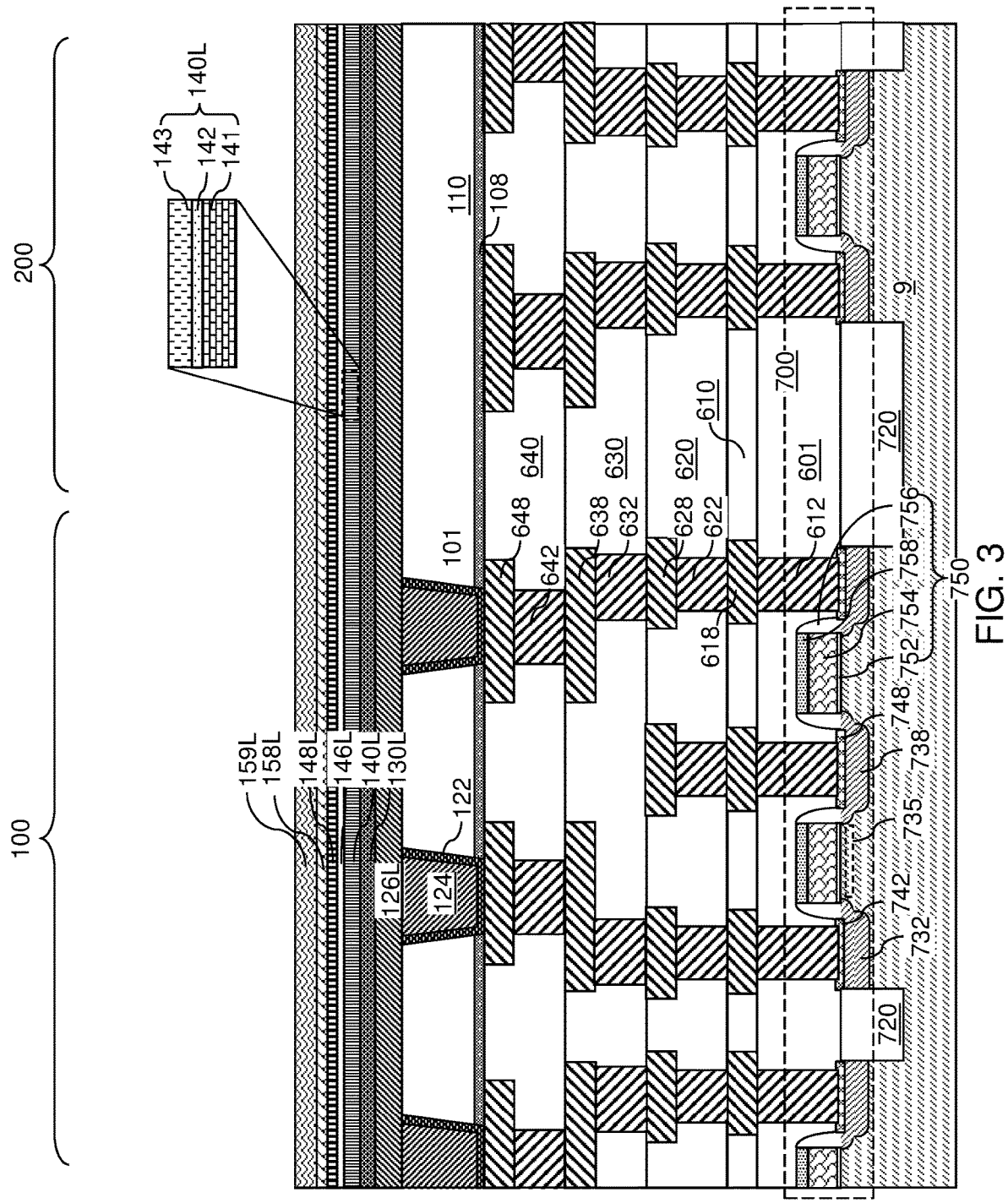
FIG. 3 is a vertical cross-sectional view of the exemplary structure after formation of a bottom electrode material layer, a nonmagnetic metallic buffer layer, a synthetic antiferromagnet layer, a nonmagnetic tunnel barrier layer, a free magnetization layer, a top electrode material layer, and a metallic etch mask material layer according to an embodiment of the present disclosure.

FIG. 3 is a vertical cross-sectional view of the exemplary structure after formation of a bottom electrode material layer, a nonmagnetic metallic buffer layer, a synthetic anti-ferromagnet layer, a nonmagnetic tunnel barrier layer, a free magnetization layer, a top electrode material layer, and a metallic etch mask material layer according to an embodiment of the present disclosure. Referring to FIG. 3, a layer stack including a bottom electrode material layer 126L, a nonmagnetic metallic buffer material layer 130L, a synthetic antiferromagnet layer 140L, a nonmagnetic tunnel barrier material layer 146L, a free magnetization material layer 148L, a top electrode material layer 158L, and a metallic etch mask material layer 159L may be formed over the metallic barrier layer and the metallic via fill material portions 124. The layers within the layer stack may be deposited by a respective chemical vapor deposition process or a respective physical vapor deposition process. Each layer within the layer stack may be deposited as planar blanket material layers having a respective uniform thickness throughout. The nonmagnetic metallic buffer material layer 130L, the synthetic antiferromagnet layer 140L, the nonmagnetic tunnel barrier material layer 146L, and the free magnetization material layer 148L are collectively referred to as memory material layers. In other words, memory material layers are formed between the bottom electrode material layer 126L and the top electrode material layer 158L.

While the present disclosure is described using an embodiment in which the memory material layers include the nonmagnetic metallic buffer material layer 130L, the synthetic antiferromagnet layer 140L, the nonmagnetic tunnel barrier material layer 146L, and the free magnetization material layer 148L, the methods and structures of the present disclosure may be applied to any structure in which the memory material layers include a different layer stack provided between a bottom electrode material layer 126L and a top electrode material layer 158L and include material layers that may store information in any manner. Modifications of the present disclosure are expressly contemplated herein in which the memory material layers include a phase change memory material, a ferroelectric memory material, or a vacancy-modulated conductive oxide material.

The bottom electrode material layer 126L includes at least one nonmagnetic metallic material such as TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the bottom electrode material layer 126L may include, and/or may consist essentially of, an elemental metal such as W, Cu, Ti, Ta, Ru, Co, Mo, or Pt. The thickness of the bottom electrode material layer 126L may be in a range from 10 nm to 100 nm, although lesser and greater thicknesses may also be used.

The nonmagnetic metallic buffer material layer 130L includes a nonmagnetic material that may function as a seed layer. Specifically, the nonmagnetic metallic buffer material layer 130L may provide a template crystalline structure that aligns polycrystalline grains of the materials of the synthetic antiferromagnet layer 140L along directions that maximizes the magnetization of a reference layer within the synthetic antiferromagnet layer 140L. The nonmagnetic metallic buffer material layer 130L may include Ti, a CoFeB alloy, a NiFe alloy, ruthenium, or a combination thereof. The thickness of the nonmagnetic metallic buffer material layer 130L may be in a range from 3 nm to 30 nm, although lesser and greater thicknesses may also be used.

The synthetic antiferromagnet (SAF) layer 140L may include a layer stack of a ferromagnetic hard layer 141, an antiferromagnetic coupling layer 142, and a reference magnetization layer 143. Each of the ferromagnetic hard layer 141 and the reference magnetization layer 143 may have a respective fixed magnetization direction. The antiferromagnetic coupling layer 142 provides antiferromagnetic coupling between the magnetization of the ferromagnetic hard layer 141 and the magnetization of the reference magnetization layer 143 so that the magnetization direction of the ferromagnetic hard layer 141 and the magnetization direction of the reference magnetization layer 143 remain fixed during operation of the memory cells to be subsequently formed. The ferromagnetic hard layer 141 may include a hard ferromagnetic material such as PtMn, IrMn, RhMn, FeMn, OsMn, etc. The reference magnetization layer 143 may include a hard ferromagnetic material such as Co, CoFe, CoFeB, CoFeTa, NiFe, CoPt, CoFeNi, etc. Other suitable materials within the contemplated scope of disclosure may also be used. The antiferromagnetic coupling layer 142 may include ruthenium or iridium. The thickness of the antiferromagnetic coupling layer 142 may be selected such that the exchange interaction induced by the antiferromagnetic coupling layer 142 stabilizes the relative magnetization directions of the ferromagnetic hard layer 141 and the reference magnetization layer 143 at opposite directions, i.e., in an antiparallel alignment. In one embodiment, the net magnetization of the SAF layer 140L may be obtained by matching the magnitude of the magnetization of the ferromagnetic hard layer 141 with the magnitude of the magnetization of the reference magnetization layer 143. The thickness of the SAF layer 140L may be in a range from 5 nm to 30 nm, although lesser and greater thicknesses may also be used.

The nonmagnetic tunnel barrier material layer 146L may include a tunneling barrier material, which may be an electrically insulating material having a thickness that allows electron tunneling. For example, the nonmagnetic tunnel barrier material layer 146L may include magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). Other suitable materials within the contemplated scope of disclosure may also be used. The thickness of the nonmagnetic tunnel barrier material layer 146L may be 0.7 nm to 1.3 nm, although lesser and greater thicknesses may also be used.

The free magnetization material layer 148L includes a ferromagnetic material having two stable magnetization directions that are parallel or antiparallel to the magnetization direction of the reference magnetization layer 143. The free magnetization material layer 148L includes a hard ferromagnetic material such as Co, CoFe, CoFeB, CoFeTa, NiFe, CoPt, CoFeNi, etc. Other suitable materials within the contemplated scope of disclosure may also be used. The thickness of the free magnetization material layer 148L may be in a range from 1 nm to 6 nm, although lesser and greater thicknesses may also be used.

The top electrode material layer 158L includes a top electrode material, which may include any nonmagnetic material that may be used for the bottom electrode material layer 126L. Exemplary metallic materials that may be used for the top electrode material layer 158L include, but are not limited to, TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the bottom electrode material layer 126L may include, and/or may consist essentially of, an elemental metal such as W, Cu, Ti, Ta, Ru, Co, Mo, or Pt. The thickness of the top electrode material layer 158L may be in a range from 10 nm to 100 nm, although lesser and greater thicknesses may also be used.

The metallic etch mask material layer 159L includes a metallic etch stop material that provides high resistance to an anisotropic etch process to be subsequently used to etch a dielectric material (which may include, for example, undoped silicate glass, a doped silicate glass, or organosilicate glass). In one embodiment, the metallic etch mask material layer 159L may include a conductive metallic nitride material (such as TiN, TaN, or WN) or a conductive metallic carbide material (such as TiC, TaC, or WC). In one embodiment, the metallic etch mask material layer 159L includes, and/or consists essentially of, TiN. The metallic etch mask material layer 159L may be deposited by chemical vapor deposition or physical vapor deposition. The thickness of the metallic etch mask material layer 159 may be in a range from 2 nm to 20 nm, such as from 3 nm, to 10 nm, although lesser and greater thicknesses may also be used.

Figure 4:
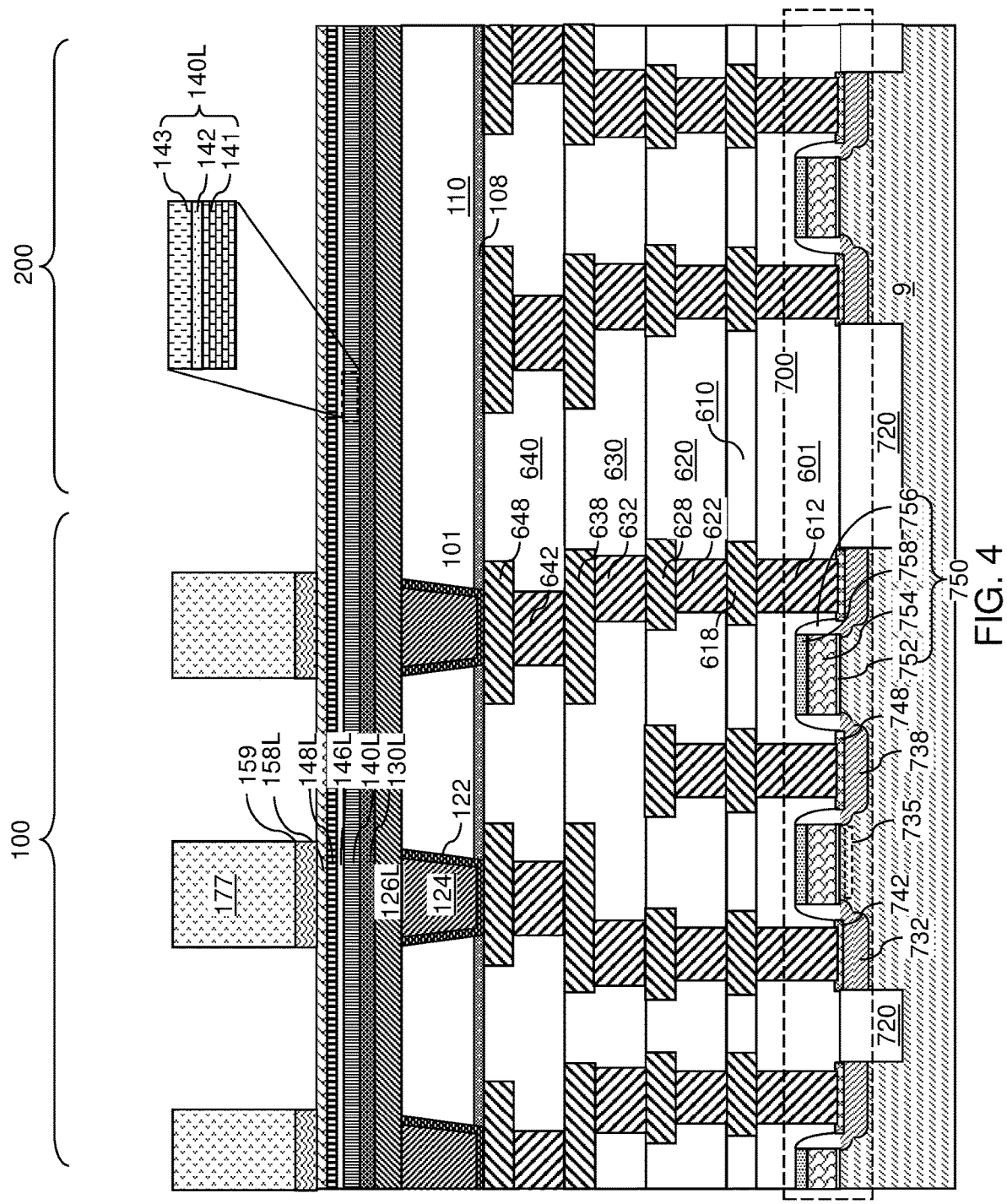
FIG. 4 is a vertical cross-sectional view of the exemplary structure after patterning the metallic etch mask material layer into metallic etch mask portions according to an embodiment of the present disclosure.

FIG. 4 is a vertical cross-sectional view of the exemplary structure after patterning the metallic etch mask material layer into metallic etch mask portions according to an embodiment of the present disclosure. Referring to FIG. 4, a photoresist layer 177 may be applied over the metallic etch mask material layer 159L, and may be lithographically patterned to form an array of discrete photoresist material portions. Each discrete photoresist material portion in the array of discrete photoresist material portions may overlie a respective one of the connection via structures (122, 124). In one embodiment, the connection via structures (122, 124) may be arranged as a two-dimensional periodic array having a first pitch along a first horizontal direction and a second pitch along a second horizontal direction. The discrete photoresist material portions may be arranged as a two-dimensional periodic array having the same periodicity as the two-dimensional periodic array of the connection via structures (122, 124).

A first anisotropic etch process may be performed to etch unmasked regions of the metallic etch mask material layer 159L. The first anisotropic etch process uses the photoresist layer 177 as an etch mask, and patterned portions of the metallic etch mask material layer 159L comprise metallic etch mask portion 159. The first anisotropic etch process patterns the metallic etch mask material layer 159L into a two-dimensional array of metallic etch mask portions 159. The two-dimensional array of metallic etch mask portions 159 may replicate the pattern of the photoresist layer 177. The photoresist layer 177 may be removed after the first anisotropic etch process, or may remain on the two-dimensional array of metallic etch mask portions 159 during a subsequent second anisotropic etch process.

Figure 5:
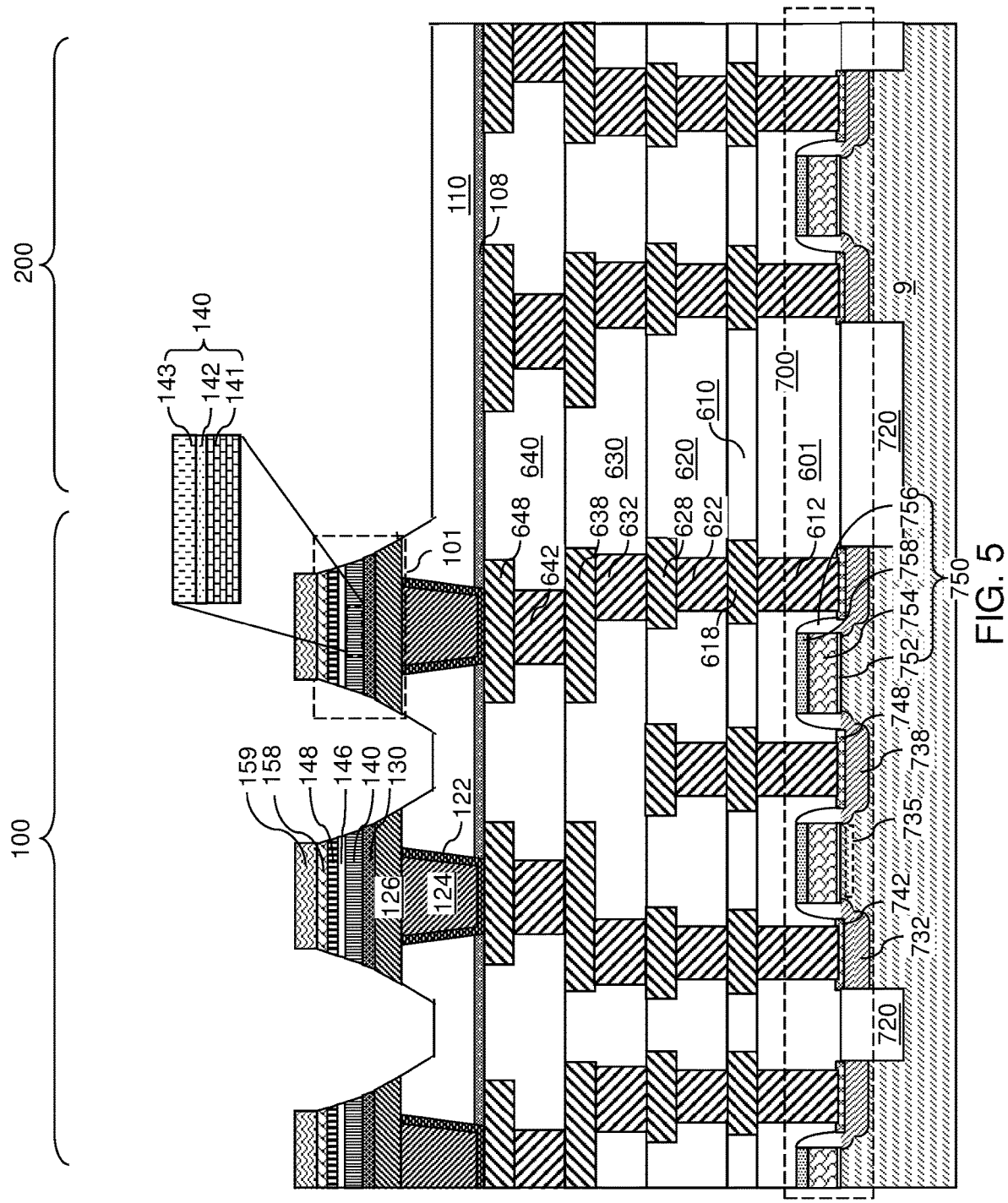
FIG. 5 is a vertical cross-sectional view of the exemplary structure after formation of an array of memory cells and an array of metallic etch stop portions according to an embodiment of the present disclosure.

FIG. 5 is a vertical cross-sectional view of the exemplary structure after formation of an array of memory cells and an array of metallic etch stop portions according to an embodiment of the present disclosure. Referring to FIG. 5, a second anisotropic etch process may be performed to transfer the pattern of the two-dimensional array of metallic etch mask portions 159 through the layer stack including the top electrode material layer 158L, the free magnetization material layer 148L, the nonmagnetic tunnel barrier material layer 146L, the synthetic antiferromagnet layer 140L, the nonmagnetic metallic buffer material layer 130L, and the bottom electrode material layer 126L. Portions of the layer stack (158L, 148L, 146L, 140L, 130L, 126L) that are not masked by the metallic etch mask portions 159 are etched during the second anisotropic etch process. In embodiments in which the photoresist layer 177 is present at the beginning of the second anisotropic etch process, the photoresist layer 177 may be collaterally consumed during the second anisotropic etch process, and the metallic etch mask portions 159 may be used as an etch mask at least during patterning of the bottom electrode material layer 126L. Alternatively, in embodiments in which the photoresist layer 177 is removed prior to the second anisotropic etch process, the metallic etch mask portions 159 may be used as an etch mask throughout the second anisotropic etch process.

The second anisotropic etch process may include a series of anisotropic etch steps that sequentially etches the various material layers of the underlying layer stack. In one embodiment, patterned portions of the layer stack may include sidewalls having a non-zero taper angle, i.e., having a non-vertical surface. The taper angle may vary from layer to layer, and generally may be in a range from 3 degrees to 30 degrees, such as from 6 degrees to 20 degrees, although lesser and greater taper angles may also be used. Unmasked portions of the connection-via-level dielectric layer 110 may be vertically recessed by the second anisotropic etch process.

Figure 16:
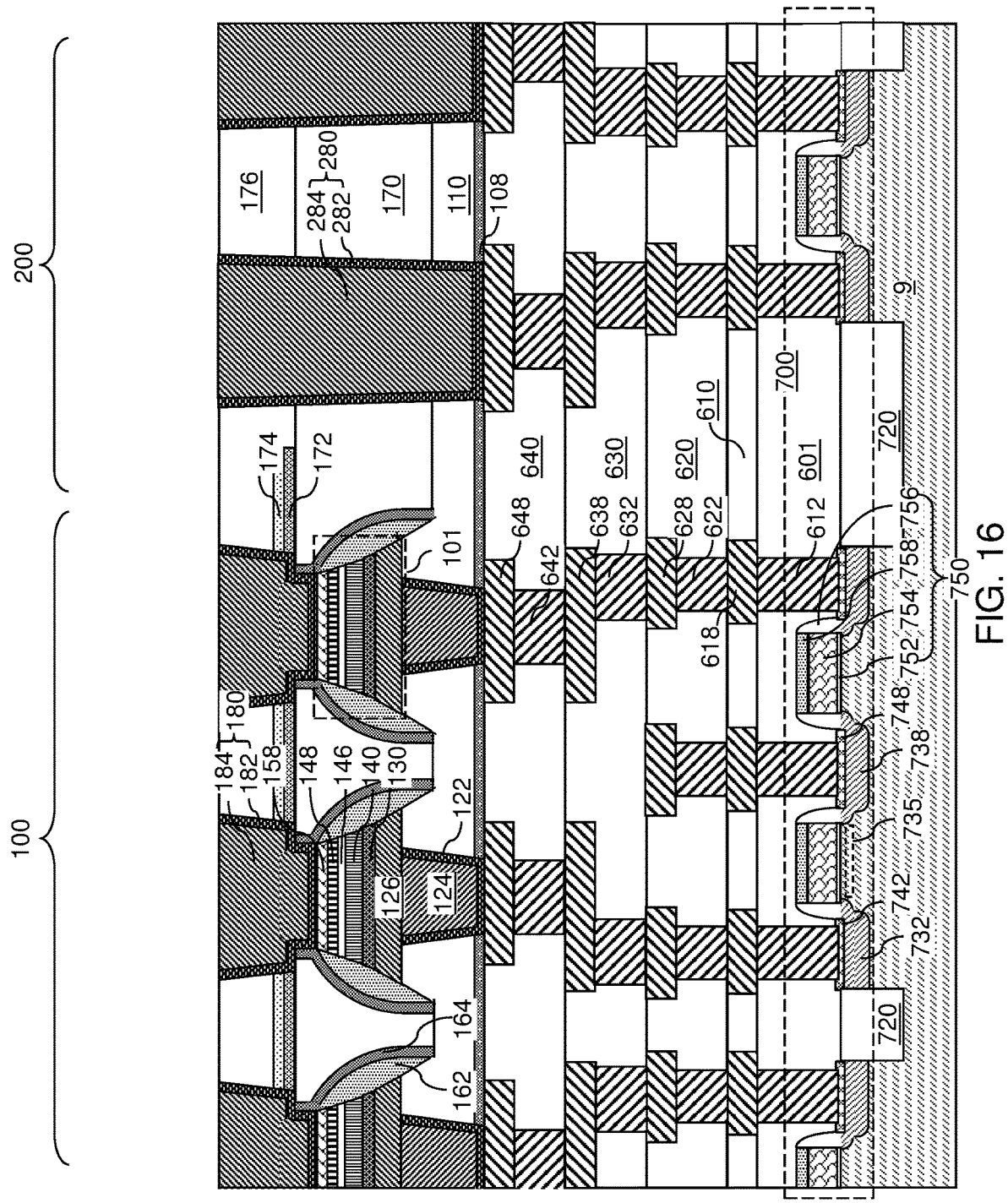
FIG. 16 is a vertical cross-sectional view of the exemplary structure after formation of an array of contact via structures according to an embodiment of the present disclosure.

The layer stack (159L, 158L, 148L, 146L, 140L, 130L, 126L) of the metallic etch mask material layer 159L, the top electrode material layer 158L, the free magnetization material layer 148L, the nonmagnetic tunnel barrier material layer 146L, the synthetic antiferromagnet layer 140L, the nonmagnetic metallic buffer material layer 130L, and the bottom electrode material layer 126L may be patterned into an array of memory cells (126, 130, 140, 146, 158) and an array of metallic etch mask portions 159 in area 101 as shown in FIG. 16. Each of the memory cells (126, 130, 140, 146, 158) comprises a bottom electrode 126, a memory material stack (130, 140, 146, 148), and a top electrode 158. Each of the metallic etch mask portion 159 is a patterned portion of the metallic etch mask material layer 159L that overlies a respective one of the memory cells (126, 130, 140, 146, 158).

In one embodiment, each memory cell (126, 130, 140, 146, 148, 158) may be a magnetic tunnel junction (MTJ) memory cell. Each MTJ memory cell (126, 130, 140, 146, 148, 158) may include a bottom electrode 126, a magnetic tunnel junction structure (140, 146, 148), and a top electrode 158. Each magnetic tunnel junction structure (140, 146, 148) may include a synthetic antiferromagnet (SAF) structure 140, a nonmagnetic tunnel barrier layer 146, and a free magnetization layer 148. A nonmagnetic metallic buffer layer 130 may be provided between the bottom electrode 126 and the magnetic tunnel junction structure (140, 146, 148). Each bottom electrode 126 is a patterned portion of the bottom electrode material layer 126L. Each SAF structure 140 is a patterned portion of the SAF layer 140L. Each nonmagnetic tunnel barrier layer 146 is a patterned portion of the nonmagnetic tunnel barrier material layer 146L. Each free magnetization layer 148 is a patterned portion of the free magnetization material layer 148L. Each top electrode 158 is a patterned portion of the metallic etch mask material layer 159L. In one embodiment, the metallic etch mask portions 159 comprise, and/or consist essentially of, a conductive metallic nitride material (such as TiN, TaN, or WN), and each of the memory cells (126, 130, 140, 146, 148, 158) comprises a vertical stack including a synthetic antiferromagnet structure 140, a nonmagnetic tunnel barrier layer 146, and a free magnetization layer 148.

Figure 6:
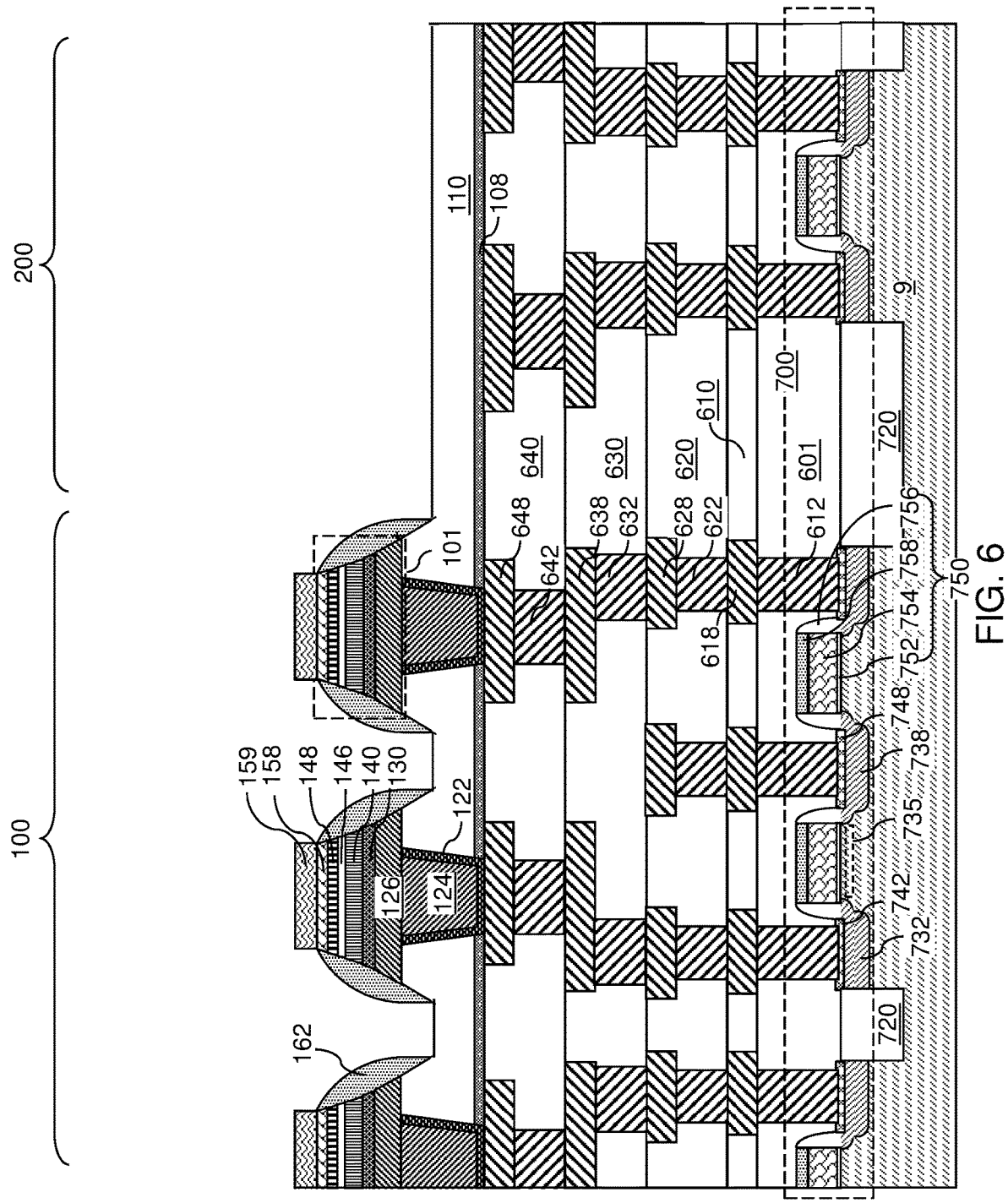
FIG. 6 is a vertical cross-sectional view of the exemplary structure after formation of an array of inner dielectric spacer portions according to an embodiment of the present disclosure.

FIG. 6 is a vertical cross-sectional view of the exemplary structure after formation of an array of inner dielectric spacer portions according to an embodiment of the present disclosure. Referring to FIG. 6, a first dielectric material such as silicon nitride may be conformally deposited over the array of memory cells (126, 130, 140, 146, 148, 158) and the array of metallic etch mask portions 159. For example, the first dielectric material may be deposited by a chemical vapor deposition process. The thickness of the first dielectric material over a horizontal surface may be in a range from 2 nm to 20 nm, such as from 4 nm to 10 nm, although lesser and greater thicknesses may also be used. An anisotropic etch process may be performed to remove horizontal portions of the first dielectric material. Remaining portions of the first dielectric material comprise an array of inner dielectric spacer portions 162 that laterally surrounds the array of memory cells (126, 130, 140, 146, 148, 158). In one embodiment, the duration of the anisotropic etch process may be selected such that sidewalls of the array of metallic etch mask portions 159 are partly or fully physically exposed. The maximum thickness of each inner dielectric spacer portion 162 may be in a range from 2 nm to 20 nm, such as from 4 nm to 10 nm, although lesser and greater thicknesses may also be used.

Figure 7:
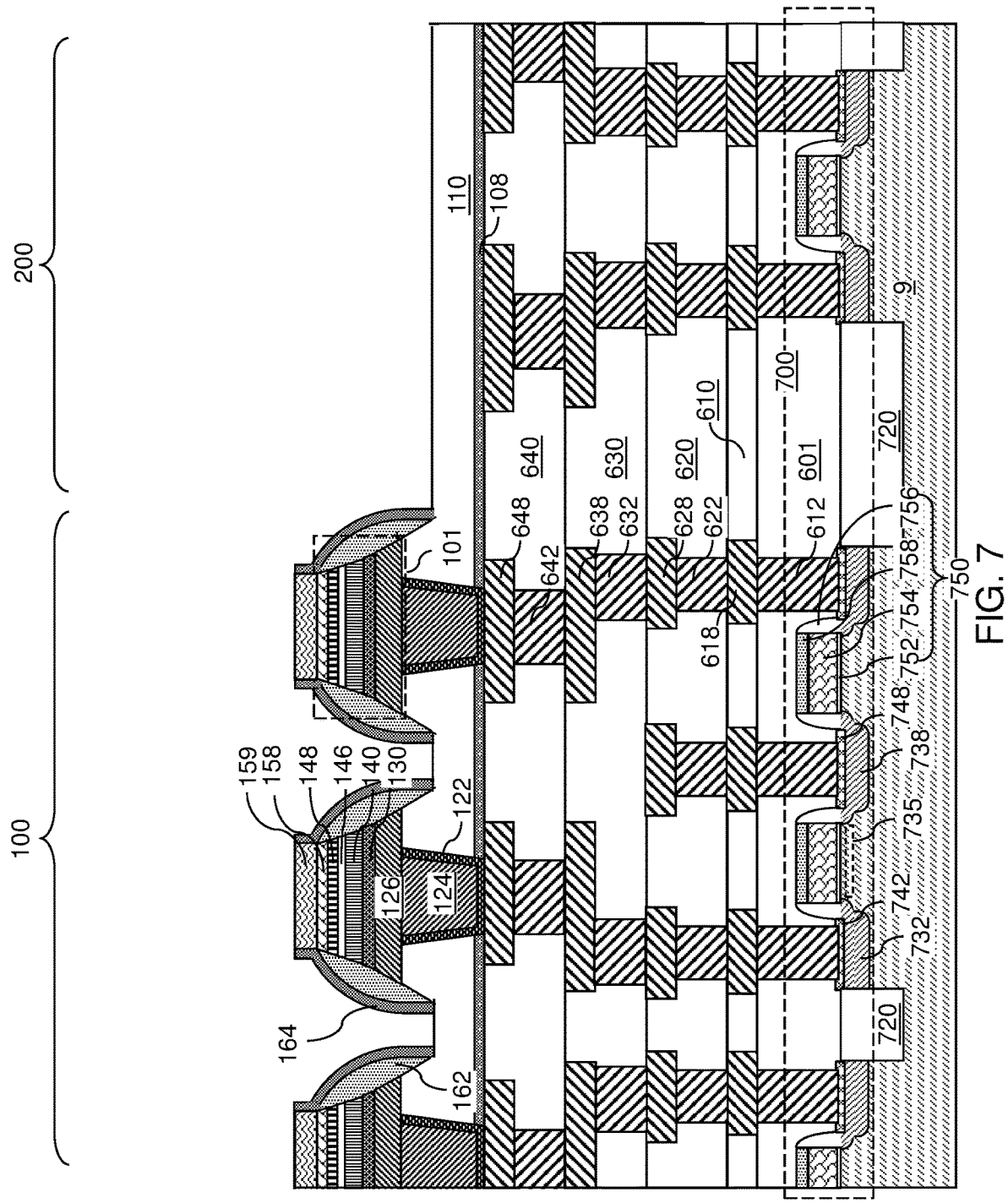
FIG. 7 is a vertical cross-sectional view of the exemplary structure after formation of an array of outer dielectric spacer portions according to an embodiment of the present disclosure.

FIG. 7 is a vertical cross-sectional view of the exemplary structure after formation of an array of outer dielectric spacer portions according to an embodiment of the present disclosure. Referring to FIG. 7, a second dielectric material such as a dielectric metal oxide may be conformally deposited over the array of inner dielectric spacer portions 162. For example, the second dielectric material may include aluminum oxide, hafnium oxide, lanthanum oxide, or yttrium oxide, and may be deposited by a chemical vapor deposition process. The thickness of the second dielectric material over a horizontal surface may be in a range from 2 nm to 20 nm, such as from 4 nm to 10 nm, although lesser and greater thicknesses may also be used. An anisotropic etch process may be performed to remove horizontal portions of the second dielectric material. Remaining portions of the second dielectric material comprise an array of outer dielectric spacer portions 164 that laterally surrounds the array of inner dielectric spacer portions 162. In one embodiment, the outer dielectric spacer portions 164 may be deposited directly on sidewalls of the metallic etch mask portions 159. In one embodiment, the entirety of each sidewall of the metallic etch mask portions 159 may contact a respective outer dielectric spacer portion 164. The maximum thickness of each outer dielectric spacer portion 164 may be in a range from 2 nm to 20 nm, such as from 4 nm to 10 nm, although lesser and greater thicknesses may also be used.

Each combination of an inner dielectric spacer portion 162 and an outer dielectric spacer portion 164 constitutes a dielectric spacer (162, 164). An array of dielectric spacers (162, 164) laterally surrounds the array of memory cells (126, 130, 140, 146, 148, 158) and the array of metallic etch mask portions 159. While the present disclosure is described using an embodiment in which a dielectric spacer (162, 164) includes an inner dielectric spacer portion 162 and an outer dielectric spacer portion 164, embodiments are expressly contemplated herein in which a dielectric spacer consists of an inner dielectric spacer portion 162 or consists of an outer dielectric spacer portion 164. Generally, a dielectric spacer (162, 164) may be formed around each metallic etch mask portion 159 within the array of metallic etch mask portions 159. Each dielectric spacer (162, 164) may be formed directly on, and around, a sidewall of a respective metallic etch mask portion 159.

Figure 8:
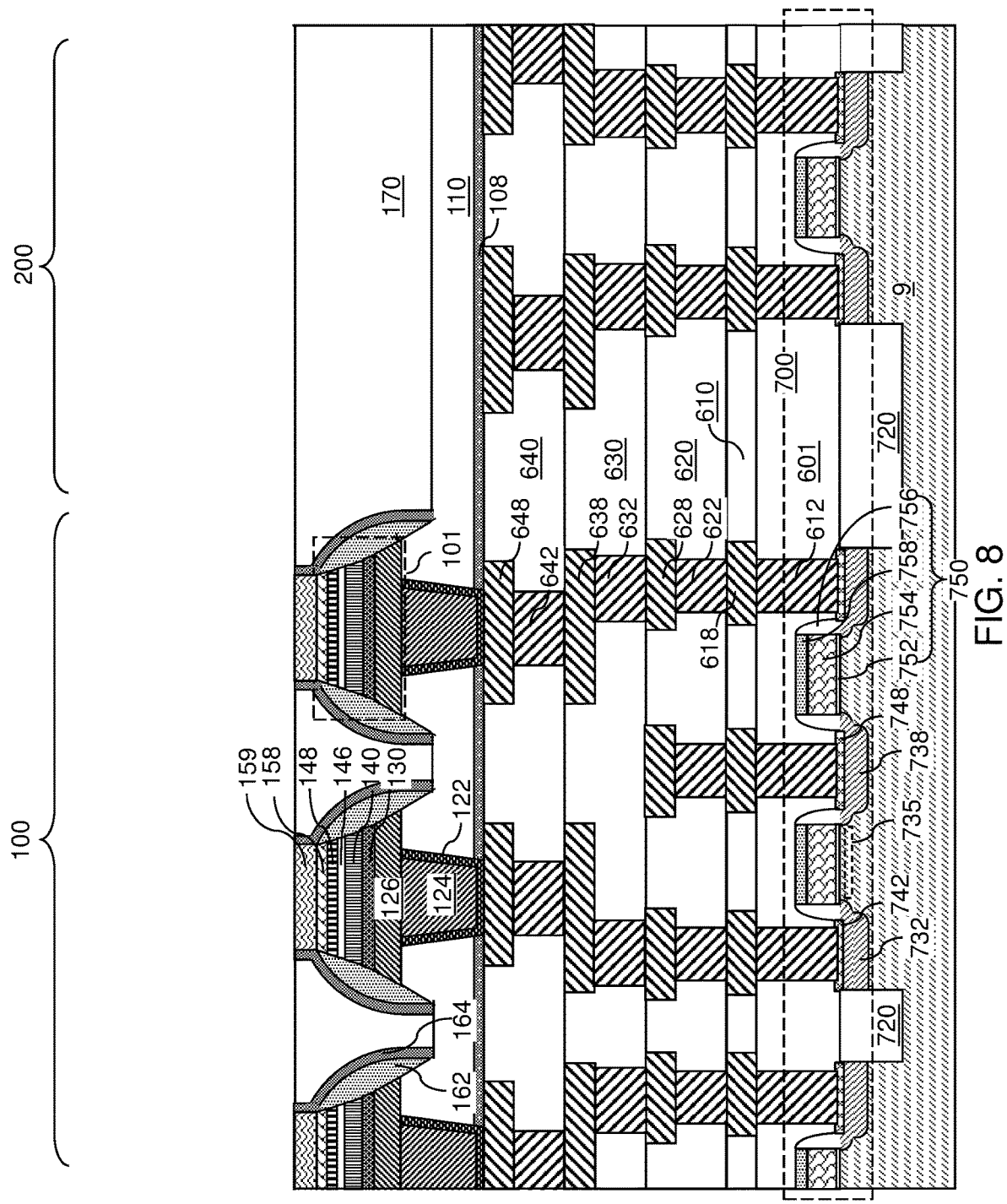
FIG. 8 is a vertical cross-sectional view of the exemplary structure after formation of a memory-level dielectric layer according to an embodiment of the present disclosure.

FIG. 8 is a vertical cross-sectional view of the exemplary structure after formation of a memory-level dielectric layer according to an embodiment of the present disclosure. Referring to FIG. 8, a memory-level dielectric layer 170 may be formed around the array of dielectric spacers (162,

164). The memory-level dielectric layer 170 includes a planarizable dielectric material such as undoped silicate glass or a doped silicate glass. The dielectric material of the memory-level dielectric layer 170 may be deposited by a conformal deposition process (such as a chemical vapor deposition process) or a self-planarizing deposition process (such as spin coating). A chemical mechanical planarization process may be performed to remove portions of the deposited dielectric material from above the horizontal plane including the top surfaces of the metallic etch mask portions 159. Various planarization assist structures (not shown) such as electrically isolated patterned portions of the metallic etch mask material layer 159L and underlying material layers may be used in the logic region 200 to assist planarization of the deposited dielectric material. Remaining portions of the deposited dielectric material after the planarization process constitute the memory-level dielectric layer 170. The top surface of the memory-level dielectric layer 170 may be within the same horizontal plane as the top surfaces of the metallic etch mask portions 159. In one embodiment, top surfaces of the dielectric spacers (162, 164), such as the top surfaces of the outer dielectric spacer portions 164, may be within the same horizontal plane as the top surface of the memory-level dielectric layer 170.

Figure 9:
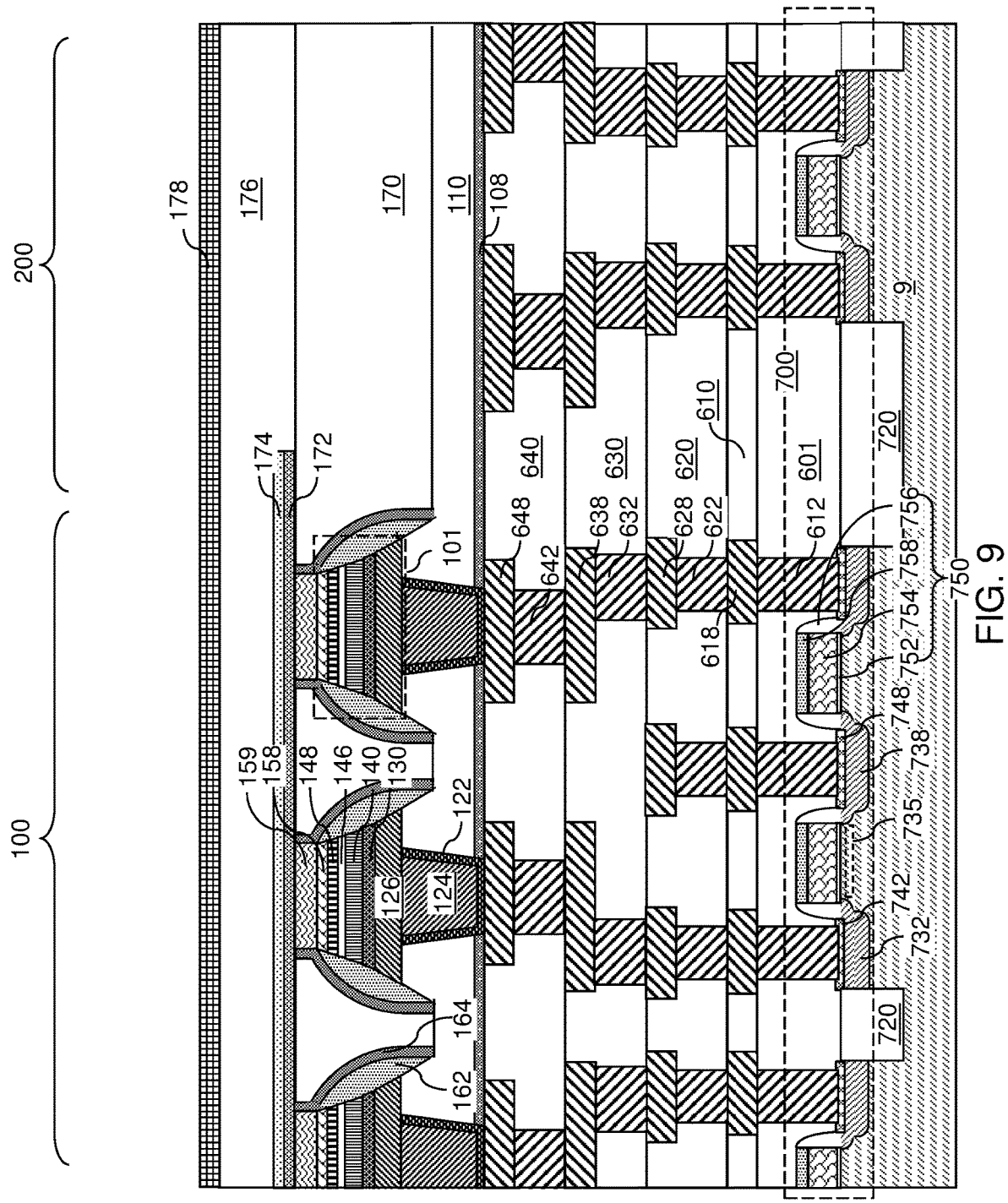
FIG. 9 is a vertical cross-sectional view of the exemplary structure after formation of dielectric etch stop layers and an via-level dielectric layer according to an embodiment of the present disclosure.

FIG. 9 is a vertical cross-sectional view of the exemplary structure after formation of dielectric etch stop layers and an via-level dielectric layer according to an embodiment of the present disclosure. Referring to FIG. 9, a first dielectric etch stop layer 172 and a second dielectric etch stop layer 174 may be sequentially deposited over the memory-level dielectric layer 170. The first dielectric etch stop layer 172 includes a dielectric material that is different from the dielectric material of the memory-level dielectric layer 170. In one embodiment, the memory-level dielectric layer 170 may include a silicon oxide-based dielectric material such as undoped silicate glass or a doped silicate glass, and the first dielectric etch stop layer 172 may include a silicon-containing dielectric material such as silicon nitride, silicon oxynitride, silicon carbide, or silicon carbide nitride. The first dielectric etch stop layer 172 may be deposited by a conformal or non-conformal deposition process. In one embodiment, the first dielectric etch stop layer 172 may be formed by chemical vapor deposition, atomic layer deposition, or physical vapor deposition. The thickness of the first dielectric etch stop layer 172 may be in a range from 2 nm to 20 nm, such as from 3 nm to 12 nm, although lesser and greater thicknesses may also be used.

The second dielectric etch stop layer 174 includes a dielectric material that is different from the dielectric material of the first dielectric etch stop layer 172. In one embodiment, the second dielectric etch stop layer 174 may include a dielectric metal oxide material such as aluminum oxide, hafnium oxide, titanium oxide, tantalum oxide, yttrium oxide, and/or lanthanum oxide. The second dielectric etch stop layer 174 may be deposited by a conformal or non-conformal deposition process. In one embodiment, the second dielectric etch stop layer 174 may be formed by chemical vapor deposition, atomic layer deposition, or physical vapor deposition. The thickness of the second dielectric etch stop layer 174 may be in a range from 2 nm to 20 nm, such as from 3 nm to 12 nm, although lesser and greater thicknesses may also be used.

The first dielectric etch stop layer 172 and the second dielectric etch stop layer 174 may be subsequently patterned so that the first dielectric etch stop layer 172 and the second dielectric etch stop layer 174 remain in the memory array region 100, and are removed from the logic region 200. For example, a photoresist layer (not shown) may be applied over the second dielectric etch stop layer 174, and may be lithographically patterned to cover the memory array region 100 without covering the logic region 200. Etch processes (such as wet etch processes) may be performed to etch unmasked portions of the first dielectric etch stop layer 172 and the second dielectric etch stop layer 174. The photoresist layer may be subsequently removed, for example, by ashing.

A via-level dielectric layer 176 may be formed above the dielectric etch stop layers (172, 174). The via-level dielectric layer 176 includes a dielectric material such as undoped silicate glass, a doped silicate glass, or organosilicate glass. The dielectric material of the via-level dielectric layer 176 may be deposited by a conformal deposition process (such as a chemical vapor deposition process) or a self-planarizing deposition process (such as spin coating). The thickness of the via-level dielectric layer 176 in the memory array region 100 may be in a range from 50 nm to 300 nm, such as from 80 nm to 200 nm, although lesser and greater thicknesses may also be used.

A via-level metallic etch mask layer 178 may be formed over the via-level dielectric layer 176. The via-level metallic etch mask layer 178 includes a metallic material that may function as an etch mask in subsequent anisotropic etch processes. For example, the via-level metallic etch mask layer 178 may include a conductive metallic nitride material (such as TiN, TaN, or WN) or a conductive metallic carbide material (such as TiC, TaC, or WC). In one embodiment, the via-level metallic etch mask layer 178 includes the same material as the metallic etch mask portions 159. In one embodiment, the via-level metallic etch mask layer 178 and the metallic etch mask portions 159 comprise, and/or consist essentially of, titanium nitride. The via-level metallic etch mask layer 178 may be formed by chemical vapor deposition or physical vapor deposition. The via-level metallic etch mask layer 178 may have a thickness in a range from 2 nm to 20 nm, such as from 3 nm to 10 nm, although lesser and greater thicknesses may also be used.

Figure 10:
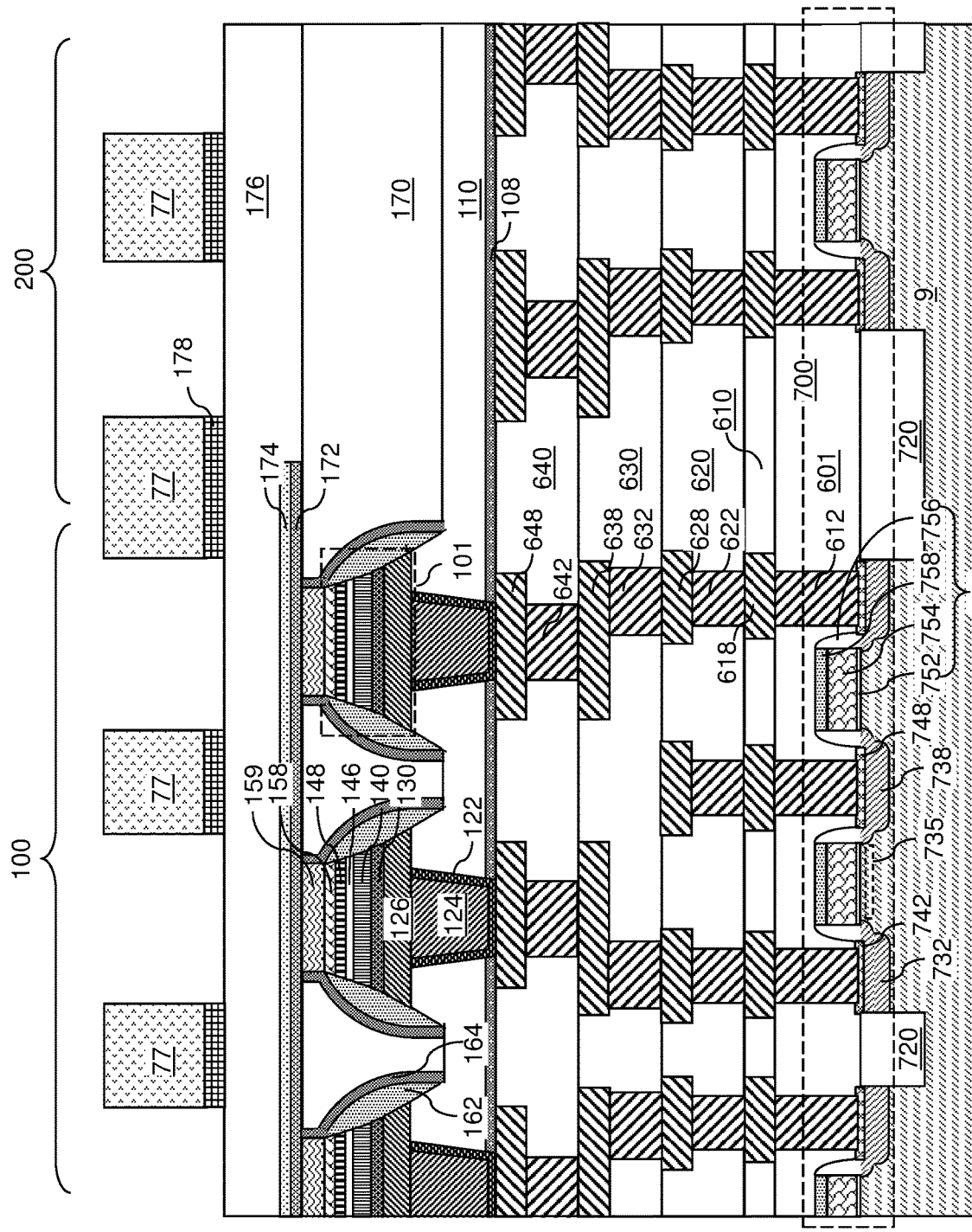
FIG. 10 is a vertical cross-sectional view of the exemplary structure after deposition and patterning of a via-level metallic etch mask layer according to an embodiment of the present disclosure.

FIG. 10 is a vertical cross-sectional view of the exemplary structure after deposition and patterning of a via-level metallic etch mask layer according to an embodiment of the present disclosure. Referring to FIG. 10, a photoresist layer 77 may be applied over the via-level metallic etch mask layer 178, and may be lithographically patterned to form an array of openings in areas that overlie the array of metallic etch mask portions 159. The area of each opening in the photoresist layer 77 may be greater than, less than, or the same as, the area of an underlying metallic etch mask portion 159. The periphery of each opening in the photoresist layer 77 may be located outside the sidewall of an underlying metallic etch mask portion 159, may be located inside the sidewall of the underlying metallic etch mask portion 159, or may coincide with the sidewall of the underlying metallic etch mask portion 159 in a plan view, i.e., a view along a vertical direction. Additional openings may be formed in the photoresist layer 77 within the logic region 200. The areas of the openings in the photoresist layer 77 in the logic region 200 may overlie the areas of the underlying metal interconnect structures such as the fourth metal line structures 648.

An etch process may be performed to transfer the pattern in the photoresist layer 77 through the via-level metallic etch mask layer 178. The etch process may include an anisotropic etch process or an isotropic etch process. In one embodiment, an anisotropic etch process such as a reactive ion etch process may be performed to transfer the pattern in the photoresist layer 77 through the via-level metallic etch mask layer 178. The photoresist layer 77 may be subsequently removed, for example, by ashing.

Figure 11:
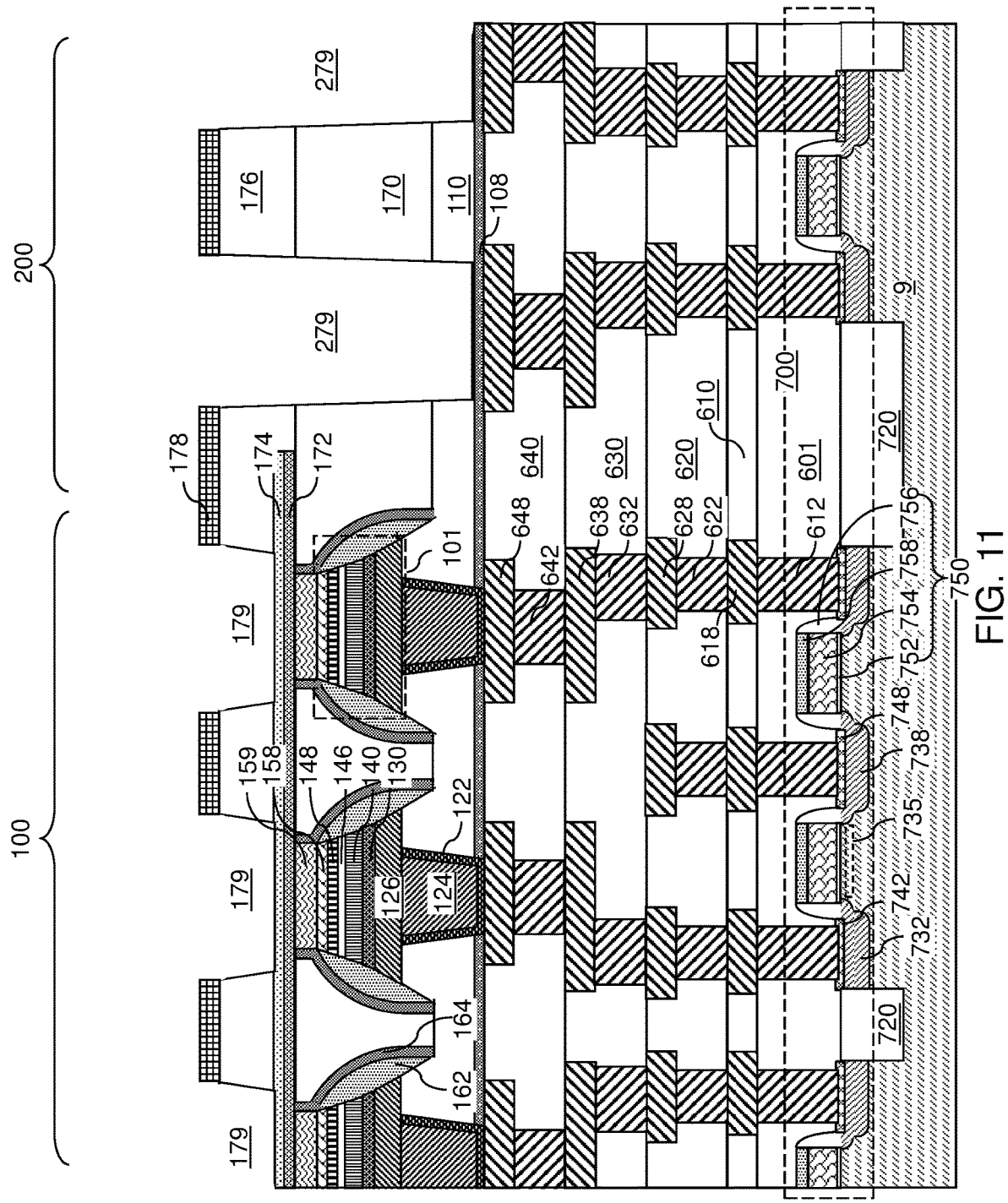
FIG. 11 is a vertical cross-sectional view of the exemplary structure after formation of an array of via cavities according to an embodiment of the present disclosure.

FIG. 11 is a vertical cross-sectional view of the exemplary structure after formation of an array of via cavities according to an embodiment of the present disclosure. Referring to FIG. 11, a first anisotropic etch process may be performed using the via-level metallic etch mask layer 178 as an etch mask. The first anisotropic etch process may comprise a reactive ion etch process that etches the dielectric materials of the via-level dielectric layer 176, the memory-level dielectric layer 170, and the connection-via-level dielectric layer 110 selective to the materials of the second dielectric etch stop layer 174 and the dielectric cap layer 108. In one embodiment, the via-level dielectric layer 176, the memory-level dielectric layer 170, and the connection-via-level dielectric layer 110 may include silicon oxide-based dielectric materials such as undoped silicate glass, a doped silicate glass, or organosilicate glass, and the first anisotropic etch process may include a reactive ion etch process that etches the silicon oxide-based dielectric material selective to the dielectric materials of the second dielectric etch stop layer 174 and the dielectric cap layer 108.

Via cavities (179, 279) may be formed underneath the opening through the via-level metallic etch mask layer 178. Specifically, first via cavities 179 vertically extending through the via-level dielectric layer 176 may be formed in the memory array region 100. A top surface of the second dielectric etch stop layer 174 may be physically exposed at the bottom of each first via cavity 179. An array of first via cavities 179 may be formed over the array of memory cells (126, 130, 140, 146, 148, 158). Second via cavities 279 vertically extending through the via-level dielectric layer 176, the memory-level dielectric layer 170, and the connection-via-level dielectric layer 110 may be formed in the logic region 200. A top surface of the dielectric cap layer 108 may be physically exposed at the bottom of each second via cavity 279.

In one embodiment, each first via cavity 179 as formed through the via-level dielectric layer 176 may have a greater lateral extent than the lateral extent of each metallic etch mask portion 159. In one embodiment, each metallic etch mask portion 159 may have a circular horizontal cross-sectional shape, an elliptical horizontal cross-sectional shape, a rectangular horizontal cross-sectional shape, or a horizontal cross-sectional shape of a rounded rectangle. In this embodiment, each first via cavity 179 may have a horizontal cross-sectional shape that is a magnification of the horizontal cross-sectional shape of one of the metallic etch mask portions 159. In an illustrative example, the maximum lateral dimension of each first via cavity 179 may be in a range from 100.1% to 150% of the maximum lateral dimension of one of the metallic etch mask portions 159.

Figure 12:
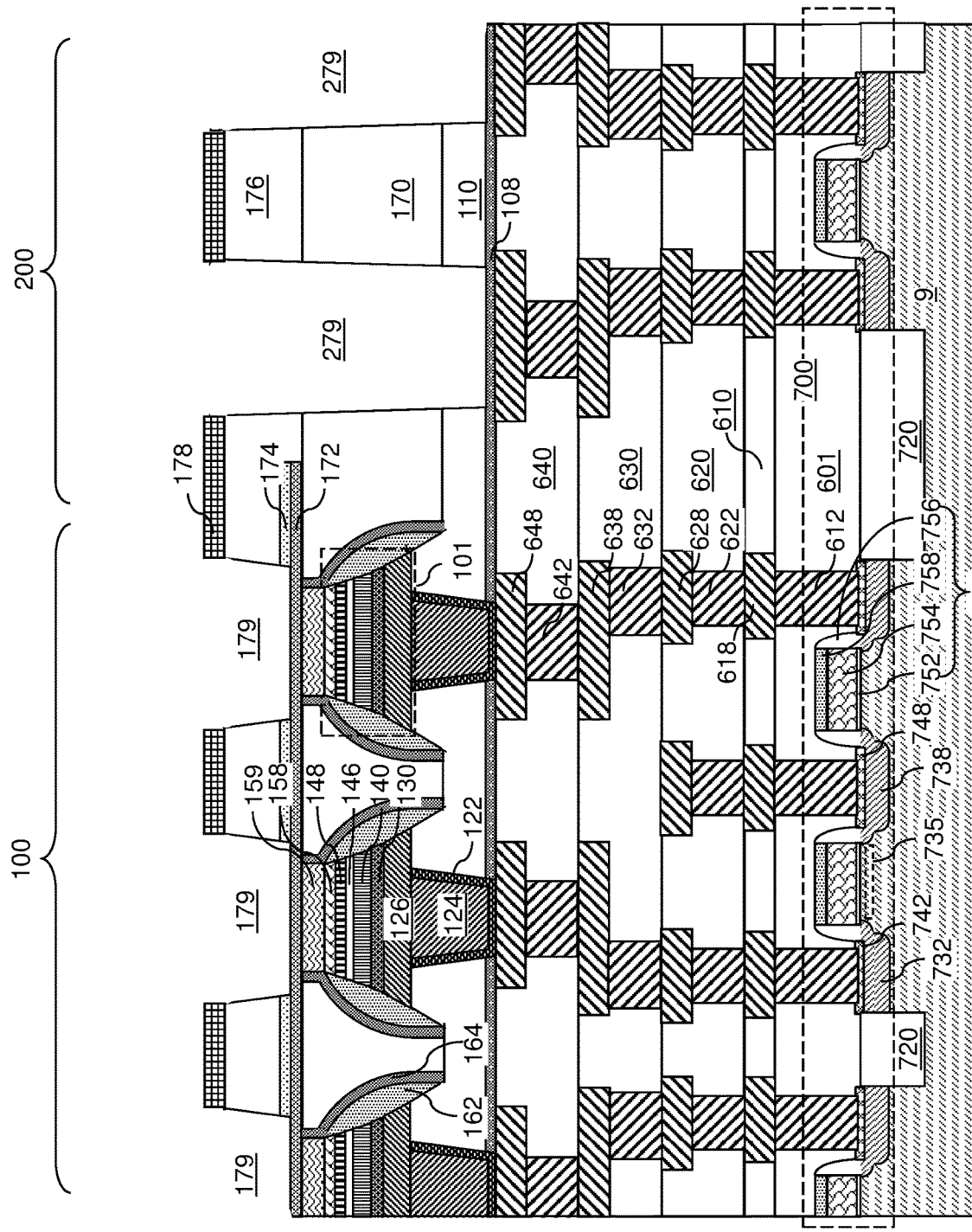
FIG. 12 is a vertical cross-sectional view of the exemplary structure after etching through physically exposed portions of a second dielectric etch stop layer according to an embodiment of the present disclosure.

FIG. 12 is a vertical cross-sectional view of the exemplary structure after etching through physically exposed portions of a second dielectric etch stop layer according to an embodiment of the present disclosure. Referring to FIG. 12, the first via cavities 179 may be vertically extended by etching physically exposed portions of the second dielectric etch stop layer 174. For example, a first wet etch process may be performed to remove physically exposed portions of the second dielectric etch stop layer 174. For example, if the second dielectric etch stop layer 174 includes a dielectric metal oxide material, a wet etch process that etches the dielectric metal oxide material selective to the dielectric materials of the via-level dielectric layer 176, the memory-level dielectric layer 170, the connection-via-level dielectric layer 110, the first dielectric etch stop layer 172, and the dielectric cap layer 108 may be used.

Figure 13:
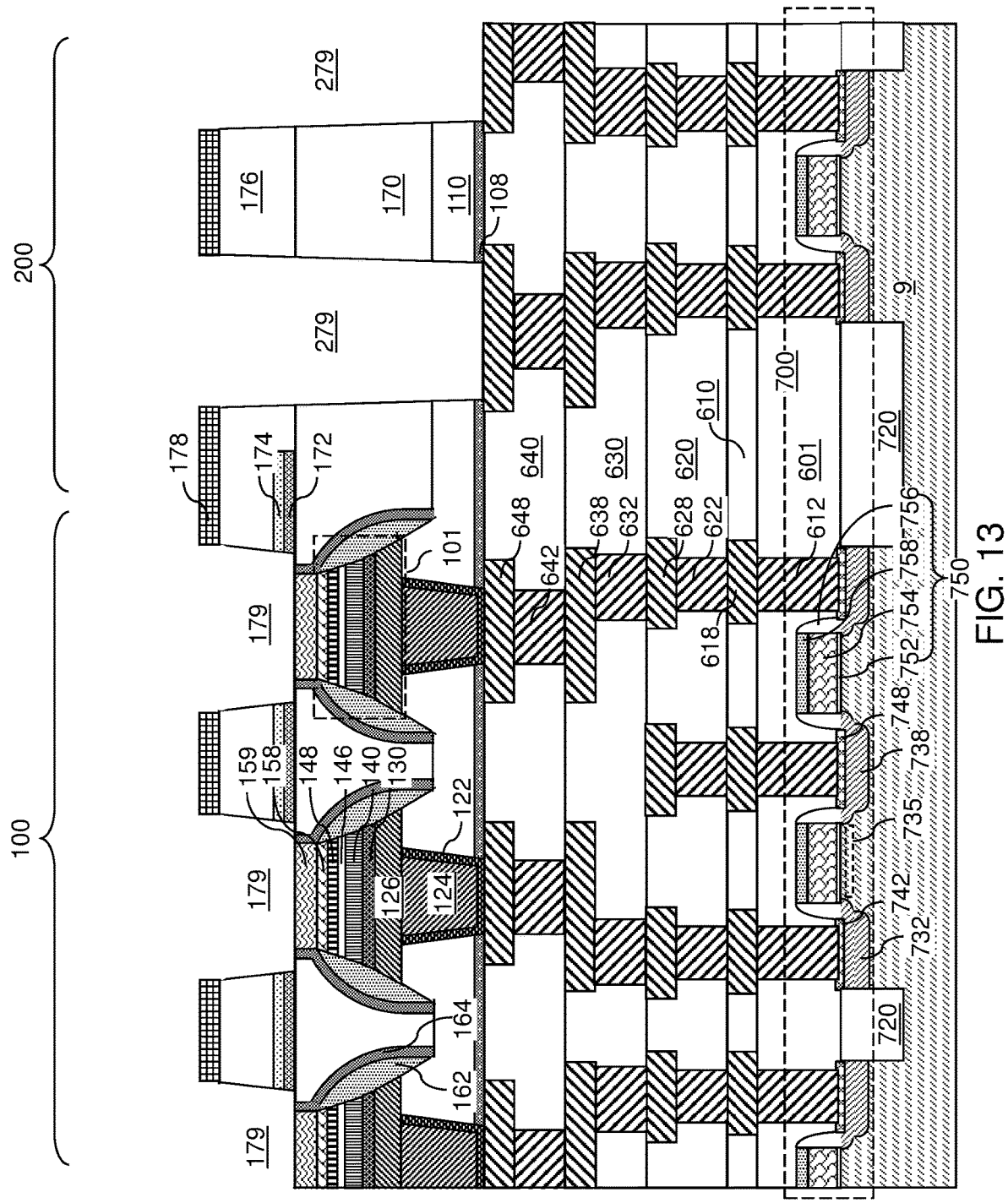
FIG. 13 is a vertical cross-sectional view of the exemplary structure after etching through physically exposed portions of a first dielectric etch stop layer according to an embodiment of the present disclosure.

FIG. 13 is a vertical cross-sectional view of the exemplary structure after etching through physically exposed portions of a first dielectric etch stop layer according to an embodiment of the present disclosure. Referring to FIG. 13, the first via cavities 179 and the second via cavities 279 may be vertically extended by etching physically exposed portions of the first dielectric etch stop layer 172 and the dielectric cap layer 108. For example, a second anisotropic etch process may be performed to remove physically exposed portions of the first dielectric etch stop layer 172 and the dielectric cap layer 108 using the via-level metallic etch mask layer 178. The chemistry of the second anisotropic etch process may be selective to the materials of the metallic etch mask portions 159, the outer dielectric spacer portions 164, and the memory-level dielectric layer 170. For example, the first dielectric etch stop layer 172 and the dielectric cap layer 108 may include silicon nitride, and the second anisotropic etch process may include a reactive ion etch process that etches silicon nitride selective to the dielectric materials of the outer dielectric spacer portions 164 and the memory-level dielectric layer 170 and selective to the metallic material of the metallic etch mask portions 159. In an illustrative example, the second anisotropic etch process may include a reactive ion etch process using HBr, $CF_4$, $O_2$, $N_2$, $CH_xF_y$, Ar, and/or He as process gases.

The first via cavities 179 vertically extend through the via-level dielectric layer 176 and the dielectric etch stop layers (172, 174), and sidewalls of the dielectric etch stop layers (172, 174) are physically exposed around each first via cavity 179. Top surfaces of the metallic etch mask portions 159 may be physically exposed underneath the array of first via cavities 179. In one embodiment, the array of first via cavities 179 may be formed as a two-dimensional periodic array.

Figure 14:
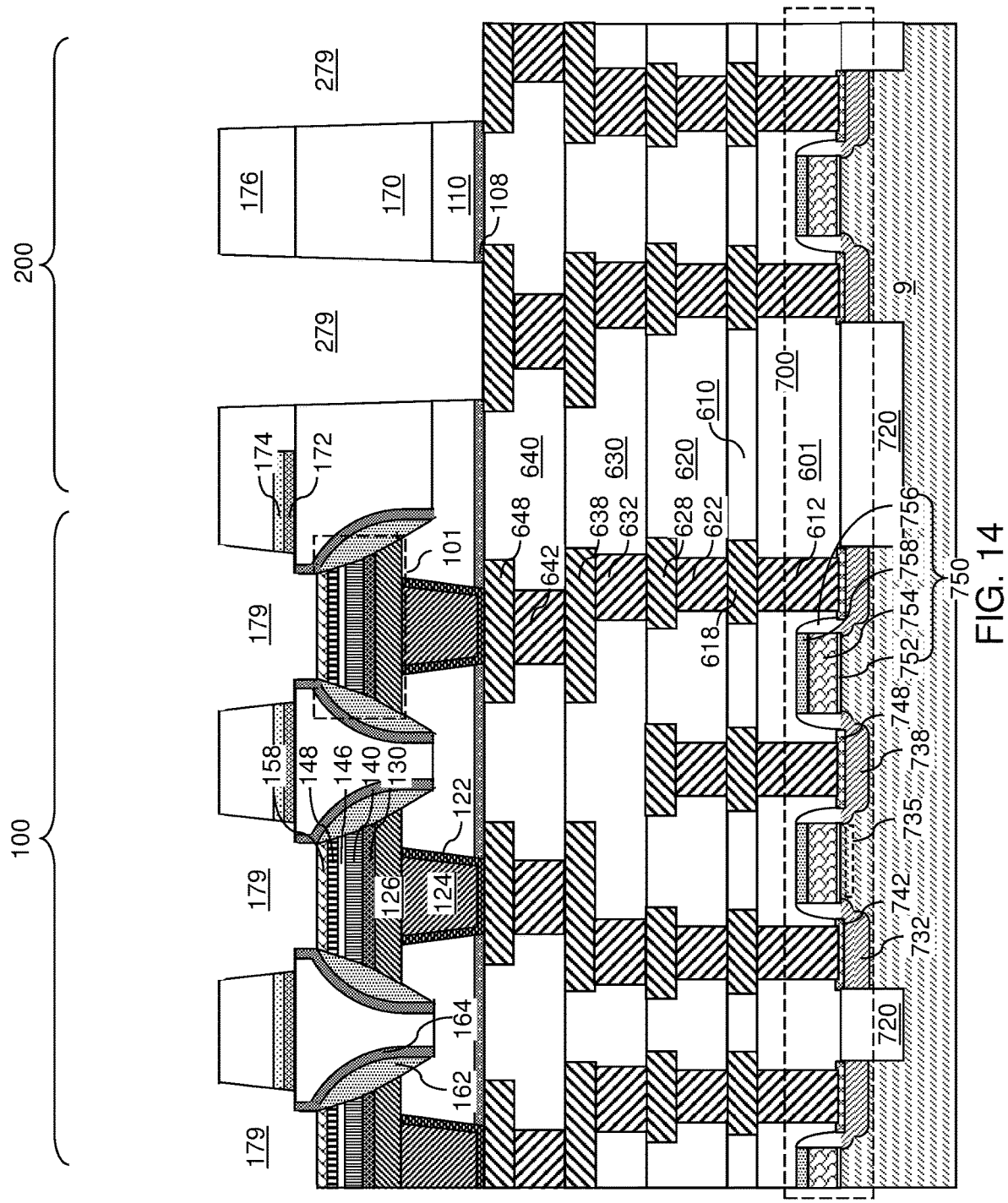
FIG. 14 is a vertical cross-sectional view of the exemplary structure after removal of metallic etch mask portions according to an embodiment of the present disclosure.

FIG. 14 is a vertical cross-sectional view of the exemplary structure after removal of metallic etch mask portions according to an embodiment of the present disclosure. Referring to FIG. 14, an etch process may be performed to etch the metallic materials of the metallic etch mask portions 159 and the via-level metallic etch mask layer 178. The etch process may include an isotropic etch process. For example, a second wet etch process may be performed to remove the metallic etch mask portions 159 and the via-level metallic etch mask layer 178. In embodiments in which the metallic etch mask portions 159 and the via-level metallic etch mask layer 178 include titanium nitride, a wet etch process for etching the metallic etch mask portions 159 and the via-level metallic etch mask layer 178 may include a combination of nitric acid and hydrofluoric acid, or SC1 solution (a combination of ammonium hydroxide, hydrogen peroxide, and water). The metallic etch mask portions 159 and the via-level metallic etch mask layer 178 may be simultaneously removed by the second wet etch process.

Generally, the metallic etch mask portions 159 may be removed selective to the materials of the top electrodes 158, the outer dielectric spacer portions 164, the memory-level dielectric layer 170, and the via-level dielectric layer 176. In other words, the etch process may be a selective etch process. In one embodiment, the array of metallic etch mask portions 159 and the via-level metallic etch mask layer 178 may comprise a same conductive metallic nitride material, and may be simultaneously removed by the etch process, which may be wet etch process. Top surfaces of the top electrodes 158 may be physically exposed underneath the array of first via cavities 179. In one embodiment, an inner sidewall of each dielectric spacer (162, 164) may be physically exposed upon removal of the array of metallic etch mask portions 159. A top surface of a metal interconnect structure (such as a fourth metal line structure 648) may be physically exposed at the bottom of each second via cavity 279.

In one embodiment, each first via cavity 179 may have an upper portion that is laterally surrounded by the dielectric etch stop layers (172, 174) and the via-level dielectric layer 176, and a downward-protruding portion that is laterally surrounded by a respective dielectric spacer (162, 164). In one embodiment, the downward-protruding portion may have a lesser lateral dimension than the upper portion of each first via cavity 179. In this embodiment, a horizontal top surface of a dielectric spacer (162, 164) and optionally a horizontal top surface of the memory-level dielectric layer 170 may be physically exposed to each first via cavity 179.

Figure 15:
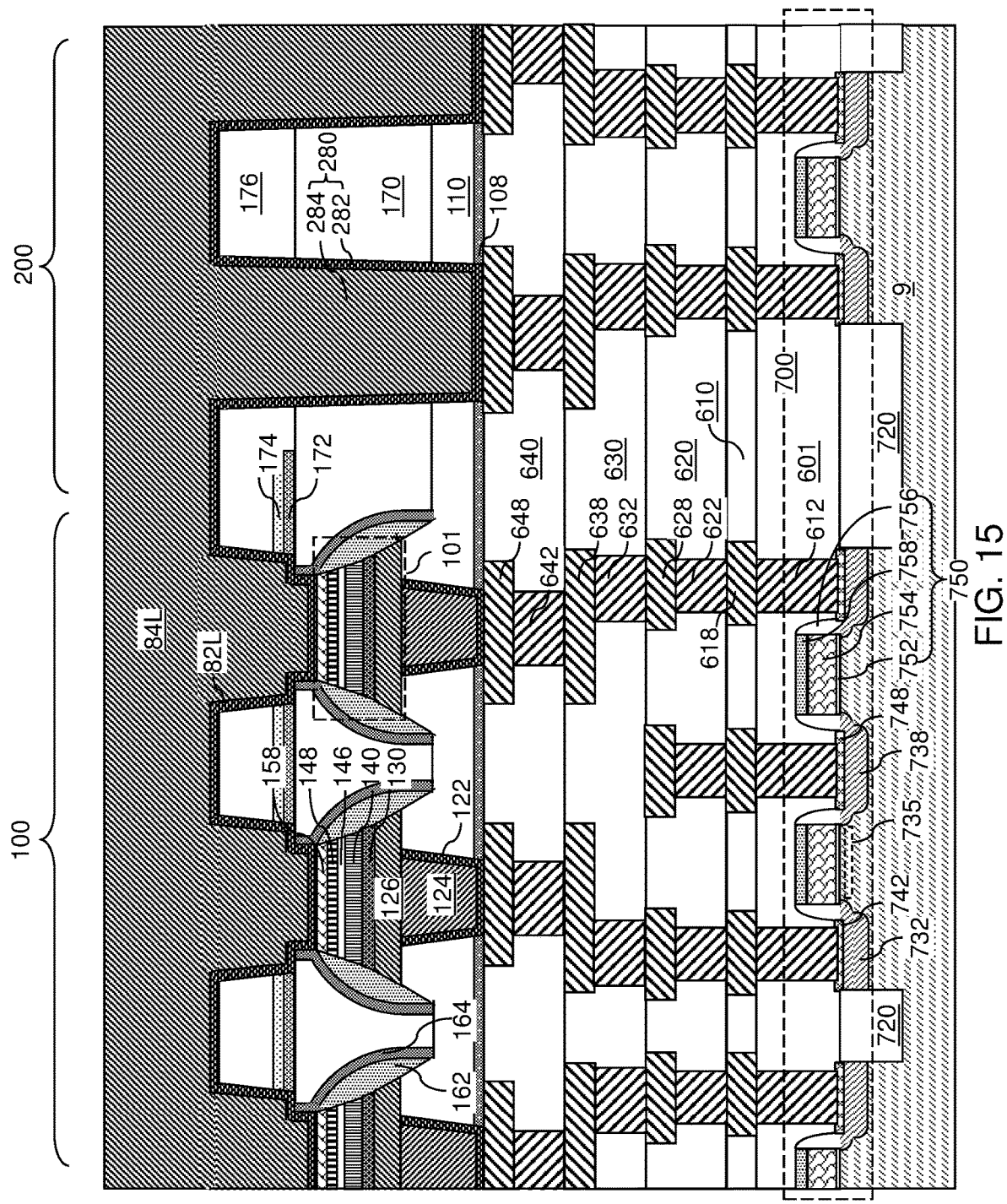
FIG. 15 is a vertical cross-sectional view of the exemplary structure after deposition of a metallic barrier layer and a metallic fill material layer in, and over, the via cavities according to an embodiment of the present disclosure.

FIG. 15 is a vertical cross-sectional view of the exemplary structure after deposition of a metallic barrier layer and a metallic fill material layer in, and over, the via cavities according to an embodiment of the present disclosure. Referring to FIG. 15, a metallic barrier layer 82L and a metallic fill material layer 84L may be sequentially deposited in, and over, each of the via cavities (179, 279). The metallic barrier layer 82L includes a metallic barrier material, i.e., a metallic material that functions as a diffusion barrier. Further, the material of the metallic barrier layer 82L may enhance adhesion of the metallic fill material layer 84L to the dielectric surfaces around the via cavities (179, 279). In one embodiment, the metallic barrier layer 82L may include a metallic nitride material such as TiN, TaN, or WN. Generally, metallic nitride materials have higher resistivity than elemental metals or intermetallic alloy of at least two elemental metals. Thus, the thickness of the metallic barrier layer 82L may be selected at a minimum level provided that the metallic barrier layer 82L provides sufficient adhesion properties and diffusion barrier properties. The thickness of the vertically-extending portions of the metallic barrier layer 82L may be in a range from 2 nm to 12 nm, such as from 3 nm to 6 nm, although lesser and greater thicknesses may also be used. The metallic barrier layer 82L may be deposited by chemical vapor deposition or physical vapor deposition. The metallic barrier layer 82L directly contacts top surfaces of the top electrodes 158. As such, there is no intervening metallic barrier material between the metallic barrier layer 82L and the top electrodes 158.

The metallic fill material layer 84L includes a metallic material that provides high electrical conductivity. For example, the metallic fill material layer 84L may include an elemental metal or an intermetallic alloy of at least two elemental metals. In one embodiment, the metallic fill material layer 84L may include W, Cu, Co, Ru, Mo, Al, alloys thereof, and/or a layer stack thereof. Other suitable materials within the contemplated scope of disclosure may also be used. The metallic fill material layer 84L may be deposited by physical vapor deposition, chemical vapor deposition, electroplating, and/or electroless plating.

FIG. 16 is a vertical cross-sectional view of the exemplary structure after formation of an array of contact via structures according to an embodiment of the present disclosure. Referring to FIG. 16, a chemical mechanical planarization (CMP) process may be performed to remove portions of the metallic fill material layer 84L and the metallic barrier layer 82L that overlie a horizontal plane including the top surface of the via-level dielectric layer 176. Each remaining portion of the metallic fill material layer 84L and the metallic barrier layer 82L that fills a first via cavity 179 comprises a contact via structure 180. Each remaining portion of the metallic fill material layer 84L and the metallic barrier layer 82L that fills a second via cavity 279 comprises a connection via structure 280. Each contact via structure 180 includes a respective metallic barrier layer 182 and a respective metallic fill material portion 184. Each connection via structure 280 includes a respective metallic barrier layer 282 and a respective metallic fill material portion 284. Each metallic barrier layer (182, 282) is a patterned portion of the metallic barrier layer 82L as deposited at the processing steps of FIG. 15. Each metallic fill material portion (184, 284) is a patterned portion of the metallic fill material layer 84L as deposited at the processing steps of FIG. 15. The top surfaces of the contact via structures 180 and the connection via structures 280 may be within the same horizontal plane as the top surface of the via-level dielectric layer 176.

Generally, the contact via structures 180 may be formed by depositing at least one conductive material in the first via cavities 179, and the connection via structures 280 may be formed by depositing the at least one conductive material in the second via cavities 279. Each contact via structure 180 may be formed directly on a top surface of a respective top electrode 158 and within a respective first via cavity 179. An array of contact via structures 180 may be formed on the top surfaces of the top electrodes 158 in the array of the first via cavities 179. In embodiments in which the upper portion of each first via cavity 179 has a greater lateral extent than the downward-protruding portion of the respective first via cavity 179, a horizontal bottom surface of the each contact via structure 180 may contact a horizontal surface of a dielectric spacer (162, 164) and/or a horizontal surface of the memory-level dielectric layer 170. In one embodiment, the horizontal surface of a contact via structure 180 that contacts the dielectric spacer (162, 164) and/or the memory-level dielectric layer 170 may include an annular bottom surface of the upper portion of the contact via structure 180.

Figure 17A:
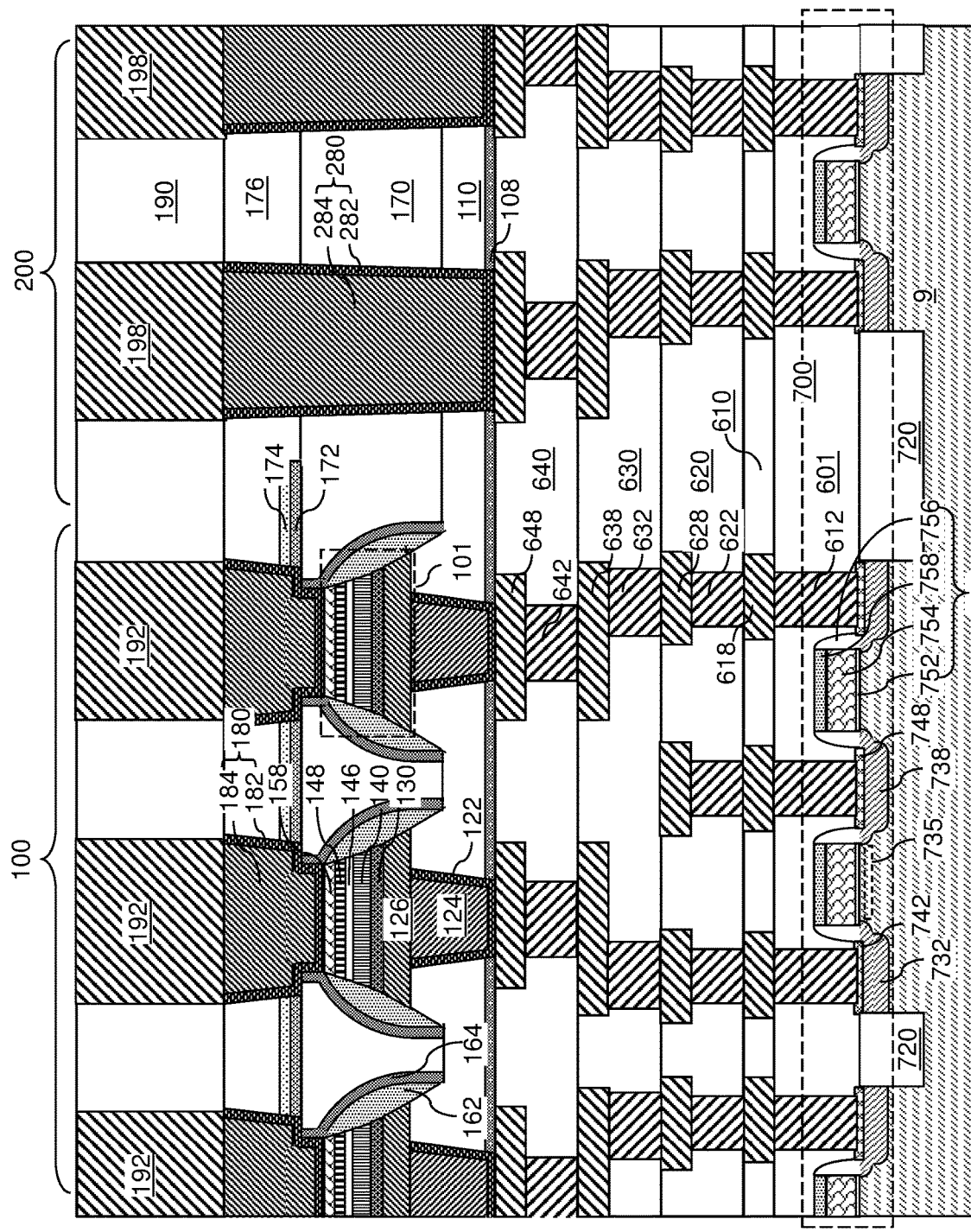
FIG. 17A is a vertical cross-sectional view of the exemplary structure after formation of a line-level dielectric layer and metal line structures according to an embodiment of the present disclosure.
Figure 17B:
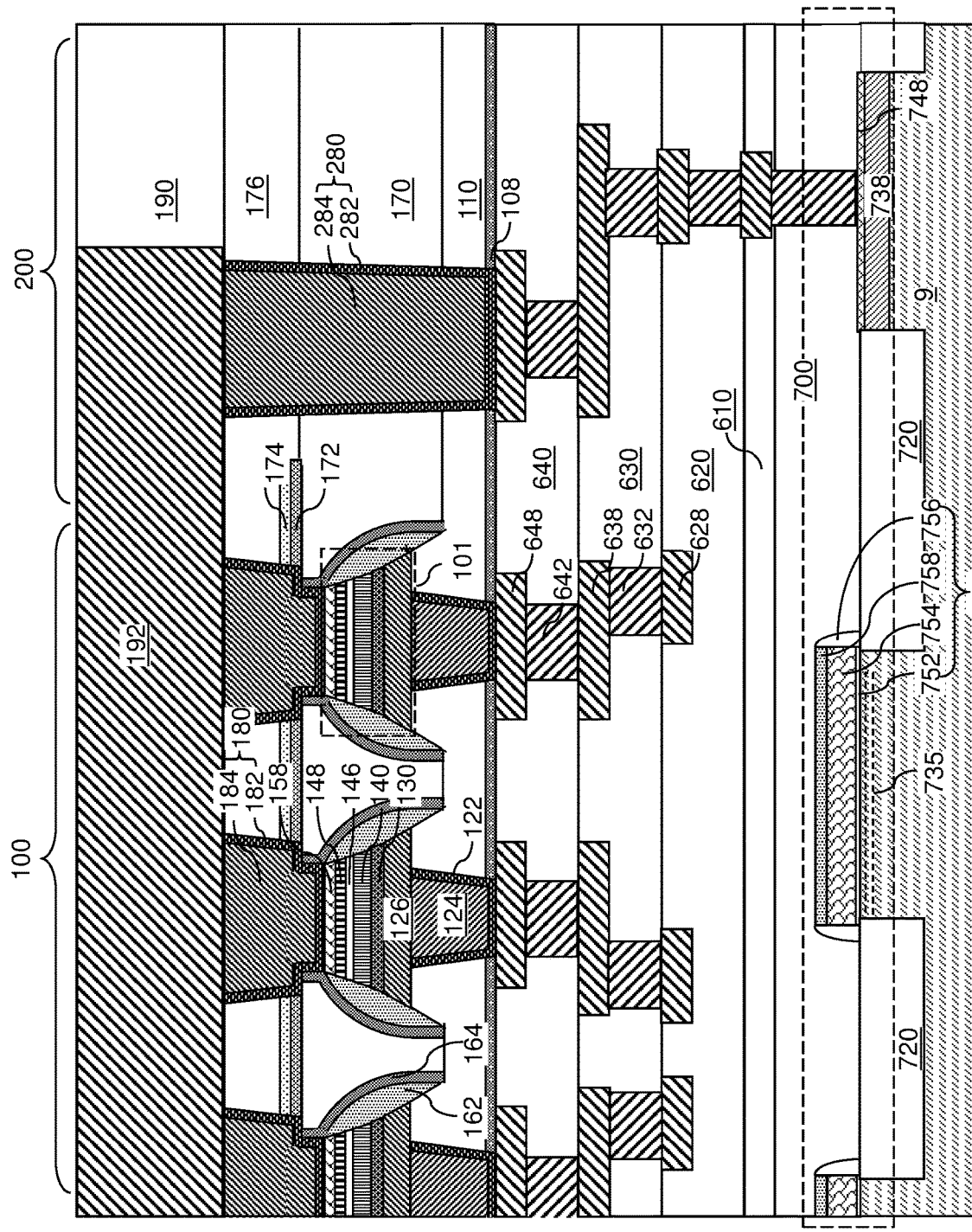
FIG. 17B is another vertical cross-sectional view of the exemplary structure of FIG. 17A along a vertical direction that is perpendicular to the plane of the vertical cross-sectional view of FIG. 17A.

FIG. 17A is a vertical cross-sectional view of the exemplary structure after formation of a line-level dielectric layer and metal line structures according to an embodiment of the present disclosure. FIG. 17B is another vertical cross-sectional view of the exemplary structure of FIG. 17A along a vertical direction that is perpendicular to the plane of the vertical cross-sectional view of FIG. 17A. Referring to FIGS. 17A and 17B, a line-level dielectric layer 190 may be deposited over the via-level dielectric layer 176. The line-level dielectric layer 190 may include any inter-layer dielectric (ILD) material. The thickness of the line-level dielectric layer 190 may be in a range from 100 nm to 600 nm, such as from 150 nm to 300 nm, although lesser and greater thicknesses may also be used.

Line trenches may be formed through the line-level dielectric layer 190, for example, by applying and patterning a photoresist layer over the line-level dielectric layer 190, and by transferring the pattern in the photoresist layer through the line-level dielectric layer 190 by performing an anisotropic etch process. The photoresist layer may be subsequently removed, for example, by ashing. At least one contact via structure 180 and/or at least one connection via structure 280 may be physically exposed at the bottom of each line trench. At least one conductive material (such as a combination of a metallic barrier material and a metallic fill material) may be deposited in the line trenches, and excess portions of the at least one conductive material may be removed from above the horizontal plane including the top surface of the line-level dielectric layer 190 by a planarization process such as a chemical mechanical planarization process. Remaining portions of the at least one conductive material that fill the line trenches comprise metal line structures (192, 198). The metal line structures (192, 198) may include array-connection metal lines 192 that contact at least one of the contact via structures 180 and logic-region metal lines 198 that do not directly contact the contact via structures 180. In one embodiment, the array-connection metal lines 192 may include word lines or bit lines for the two-dimensional array of memory cells (126, 130, 140, 146, 148, 158).

Figure 18:
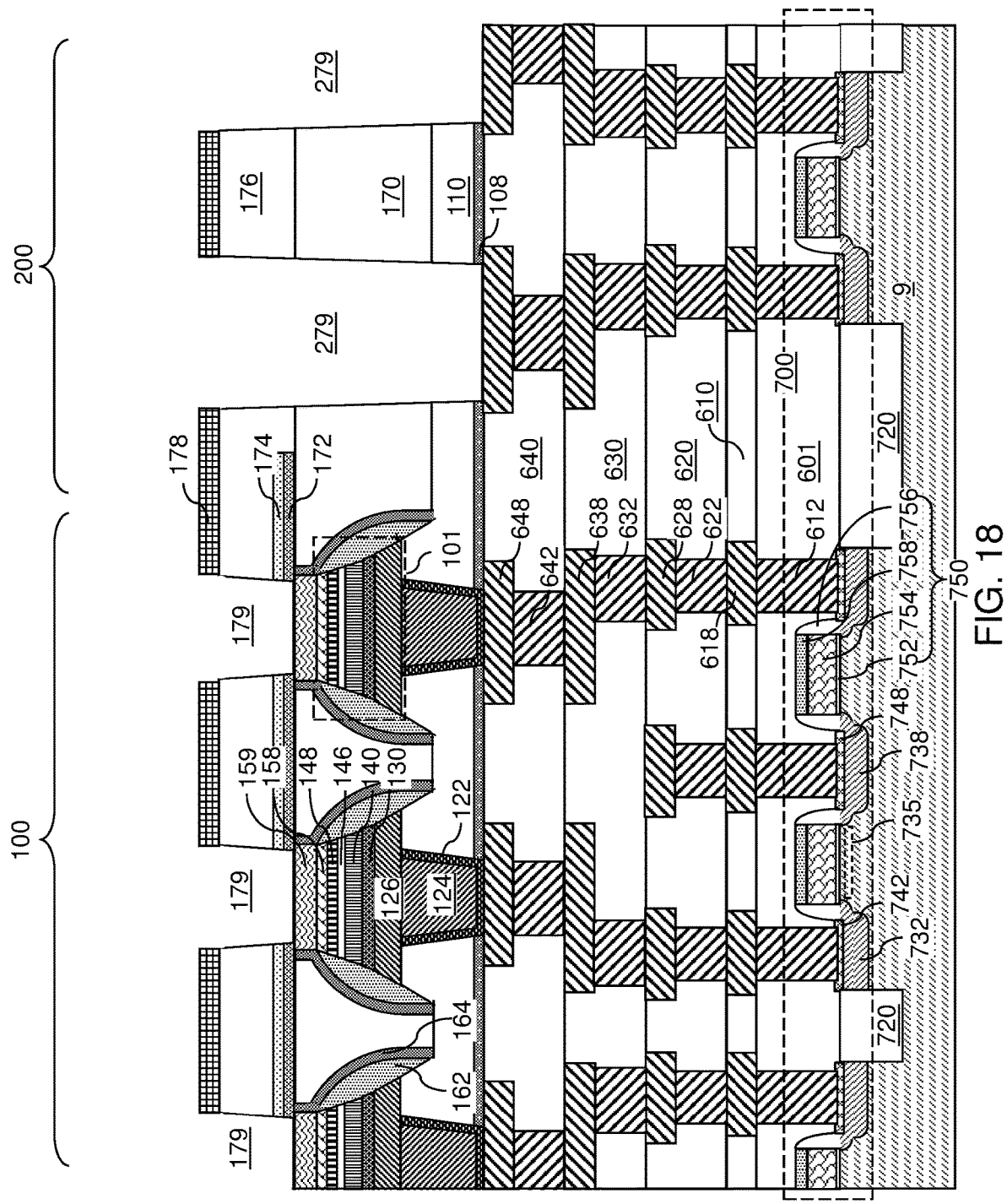
FIG. 18 is a vertical cross-sectional view of a first alternative embodiment of the exemplary structure after physically exposing top surfaces of the metallic etch mask portions underneath an array of via cavities according to an embodiment of the present disclosure.

FIG. 18 is a vertical cross-sectional view of a first alternative embodiment of the exemplary structure after physically exposing top surfaces of the metallic etch mask portions underneath an array of via cavities according to an embodiment of the present disclosure. Referring to FIG. 18, a first alternative embodiment of the exemplary structure may be derived from the exemplary structure of FIG. 13 by reducing the lateral dimensions of the first via cavities 179 such that each first via cavity 179 has a lateral dimension (i.e., the maximum lateral dimension) that is less than the lateral dimension of a respective underlying metallic etch mask portion 159. In this embodiment, the entire bottom surface of each first via cavity 179 may be a portion of a top surface of a respective underlying metallic etch mask portion 159.

Figure 19:
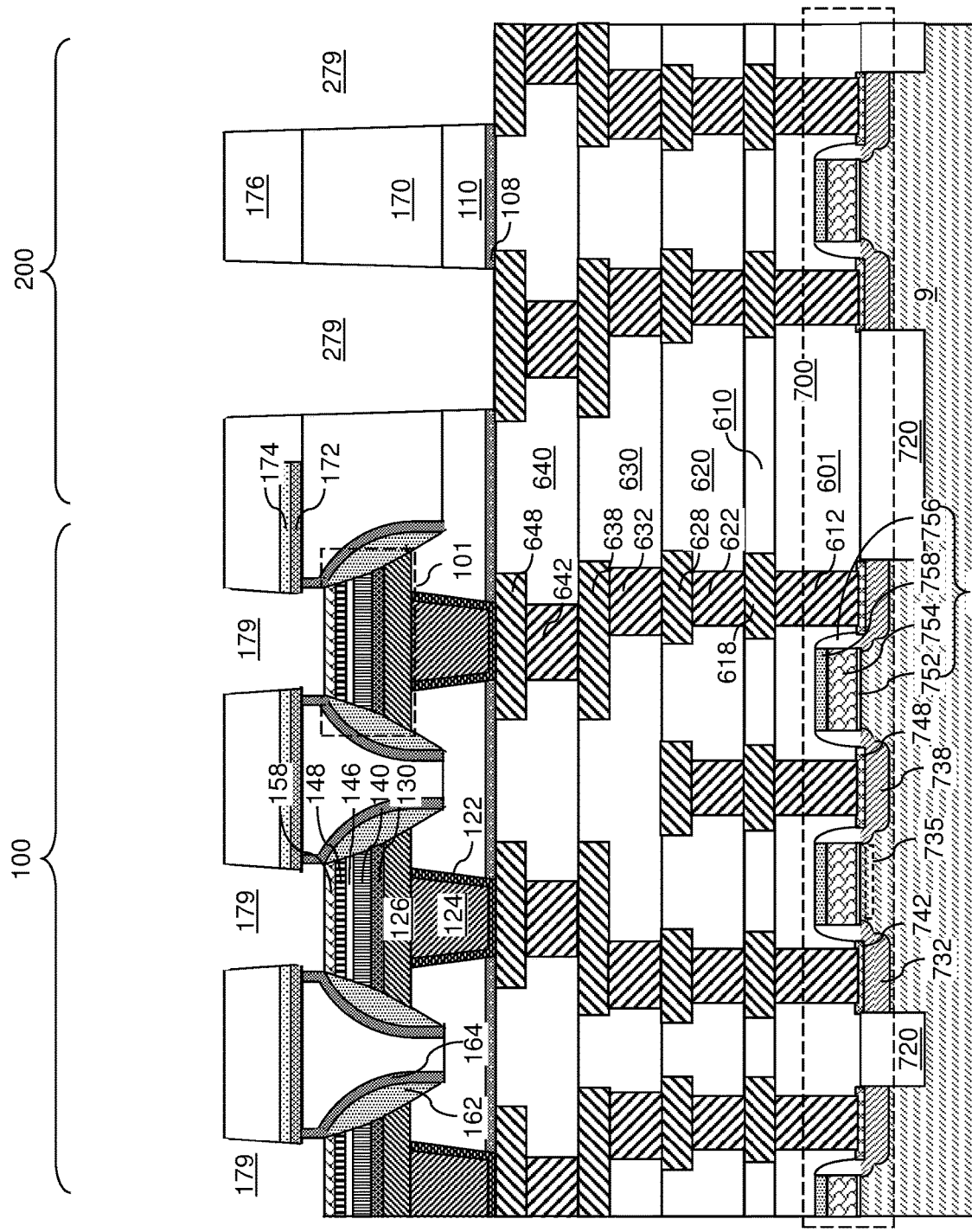
FIG. 19 is a vertical cross-sectional view of the first alternative embodiment of the exemplary structure after removing the metallic etch mask portions according to an embodiment of the present disclosure.

FIG. 19 is a vertical cross-sectional view of the first alternative embodiment of the exemplary structure after removing the metallic etch mask portions according to an embodiment of the present disclosure. Referring to FIG. 19, the processing steps of FIG. 14 may be performed to simultaneously remove the metallic etch mask portions 159 and the via-level metallic etch mask layer 178. Each first via cavity 179 may have an upper portion and a downward-protruding portion that has a greater lateral extent than the upper portion. Inner sidewalls of the dielectric spacers (162, 164) may be physically exposed around the downward-protruding portions of the first via cavities 179. A top surface of a top electrode 158 is physically exposed at the bottom of each first via cavity 179.

Figure 20:
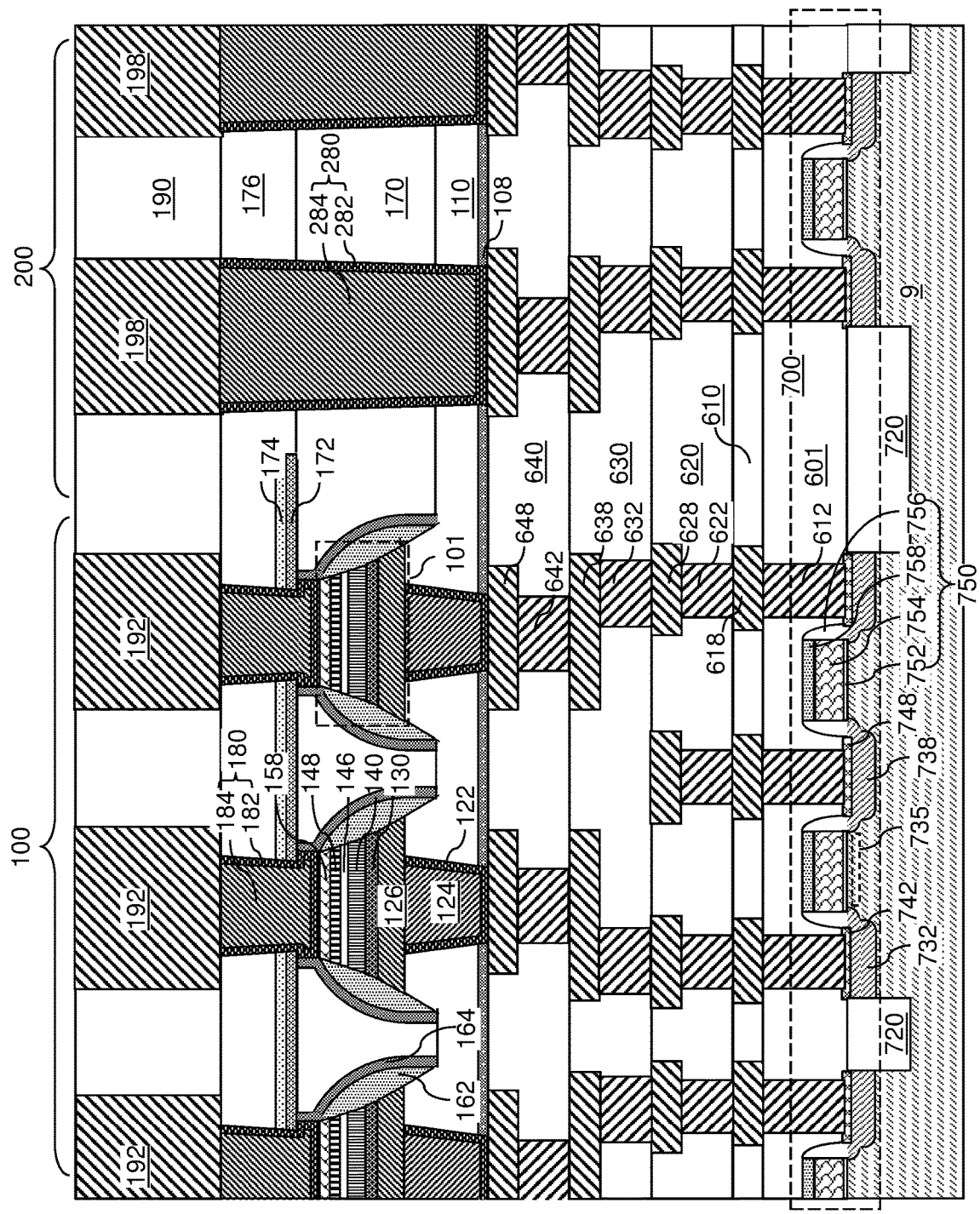
FIG. 20 is a vertical cross-sectional view of the first alternative embodiment of the exemplary structure after formation of a line-level dielectric layer and metal line structures according to an embodiment of the present disclosure.

FIG. 20 is a vertical cross-sectional view of the first alternative embodiment of the exemplary structure after formation of a line-level dielectric layer and metal line structures according to an embodiment of the present disclosure. Referring to FIG. 20, the processing steps of FIGS. 15-17B may be performed. Each contact via structure 180 may have an upper portion and a downward-protruding portion. The upper portion of each contact via structure 180 has a lesser lateral extent than the downward-protruding portion of the contact via structure 180. A horizontal bottom surface of the each contact via structure 180 may contact a horizontal surface of a dielectric etch stop layer such as a horizontal surface of the first dielectric etch stop layer 172. In one embodiment, the horizontal surface of a contact via structure 180 that contacts the first dielectric etch stop layer 172 may include an annular top surface of the downward-protruding portion of the contact via structure 180.

Figure 21:
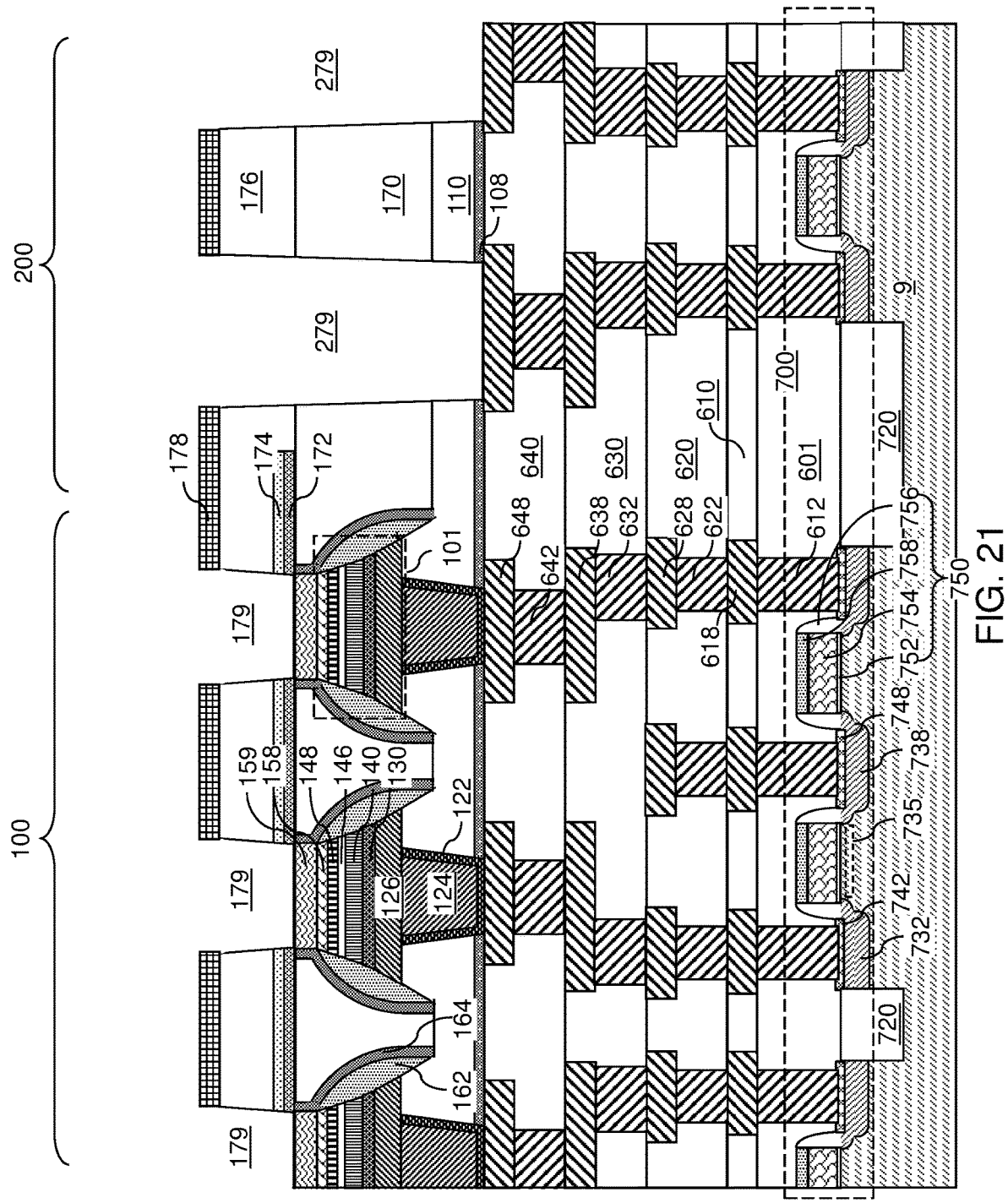
FIG. 21 is a vertical cross-sectional view of a second alternative embodiment of the exemplary structure after physically exposing top surfaces of the metallic etch mask portions underneath an array of via cavities according to an embodiment of the present disclosure.

FIG. 21 is a vertical cross-sectional view of a second alternative embodiment of the exemplary structure after physically exposing top surfaces of the metallic etch mask portions underneath an array of via cavities according to an embodiment of the present disclosure. Referring to FIG. 21, a second alternative embodiment of the exemplary structure may be derived from the exemplary structure of FIG. 13 by reducing the lateral dimensions of the first via cavities 179 such that each first via cavity 179 has the same lateral dimension (i.e., the maximum lateral dimension) as a respective underlying metallic etch mask portion 159. In this embodiment, the bottom periphery of a first via cavity 179 may coincide with the outer periphery of the top surface of an underlying metallic etch mask portion 159.

Figure 22:
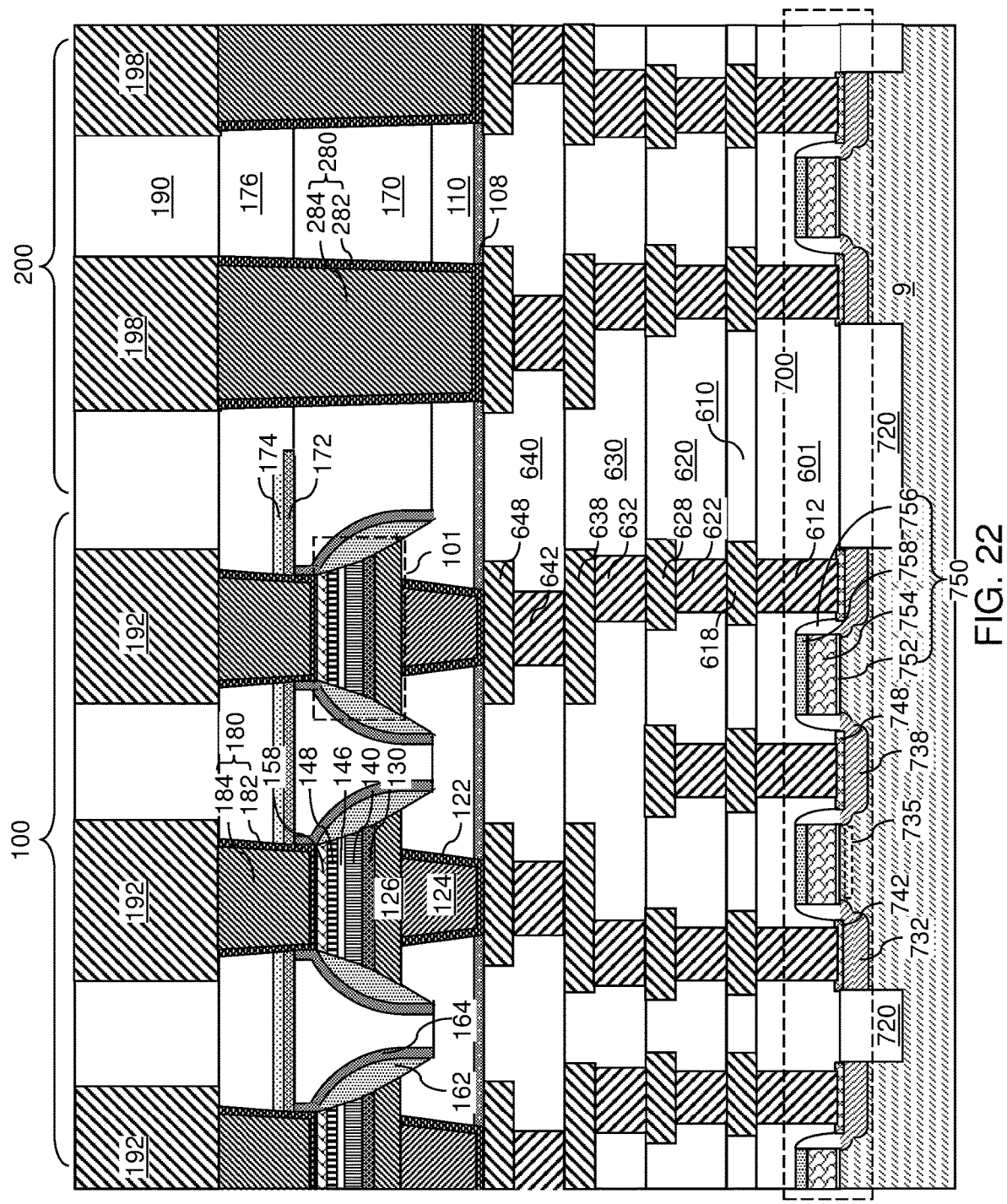
FIG. 22 is a vertical cross-sectional view of the second alternative embodiment of the exemplary structure after formation of a line-level dielectric layer and metal line structures according to an embodiment of the present disclosure.

FIG. 22 is a vertical cross-sectional view of the second alternative embodiment of the exemplary structure after formation of a line-level dielectric layer and metal line structures according to an embodiment of the present disclosure. Referring to FIG. 22, the processing steps of FIGS. 15-17B may be performed. Each contact via structure 180 may have an upper portion and a downward-protruding portion having a same lateral extent as the upper portion. The upper portion of each contact via structure 180 may be located above the horizontal plane including the top surface of the memory-level dielectric layer 170, and the downward-protruding portion of each contact via structure 180 may be located below the horizontal plane including the top surface of the memory-level dielectric layer 170.

Figure 23:
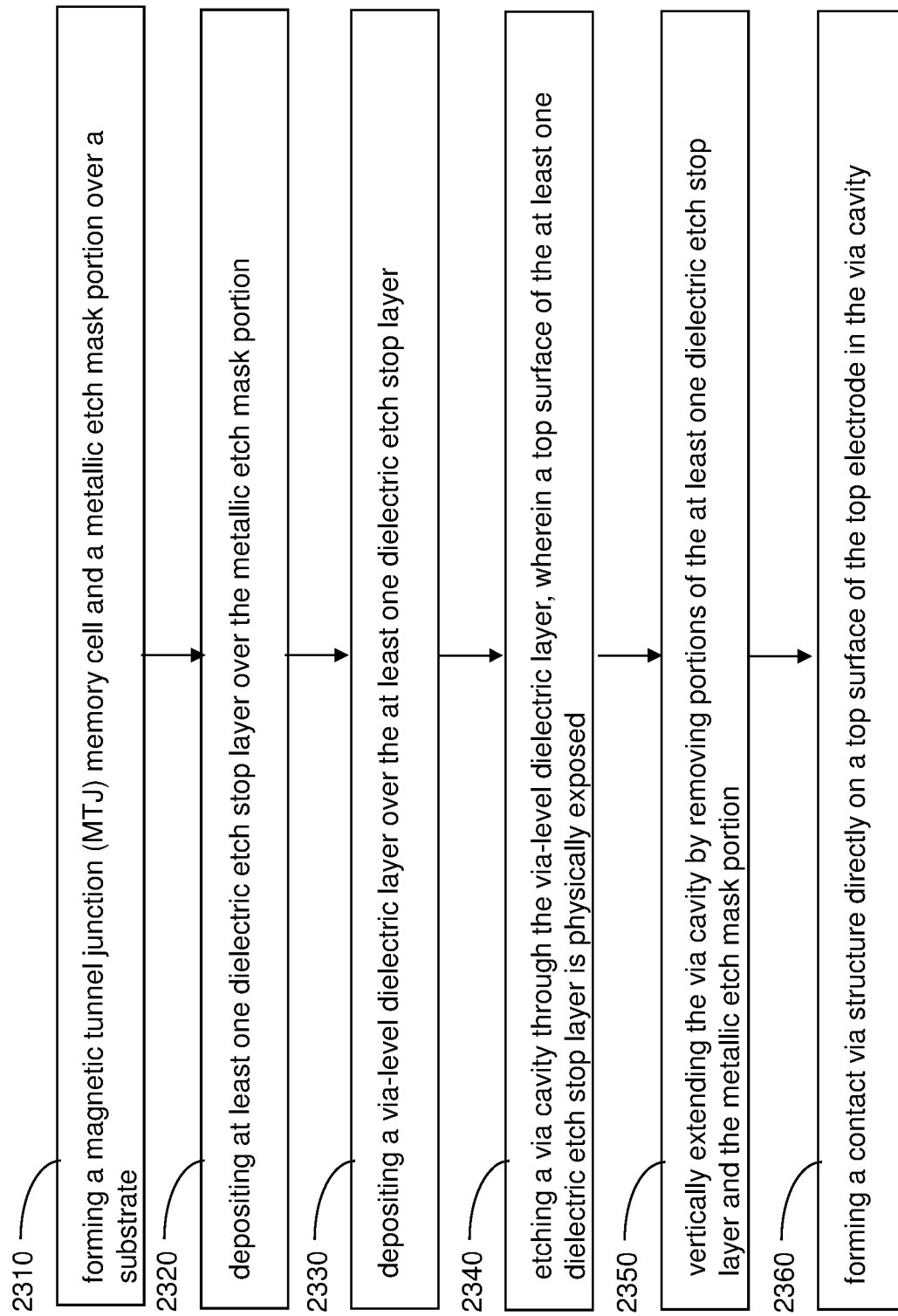
FIG. 23 is a first flowchart that illustrates the general processing steps of the methods of the present disclosure.

Referring to FIG. 23, a first flowchart illustrates the general processing steps of the methods of the present disclosure for forming a single magnetic tunnel junction memory cell (126, 130, 140, 146, 148, 258) and a contact via structure 180 therefor. A magnetic tunnel junction memory device may be formed by this method. Referring to step 2310 and FIGS. 1-5, a magnetic tunnel junction (MTJ) memory cell (126, 130, 140, 146, 148, 258) and a metallic etch mask portion 159 may be formed over a substrate 9. The MTJ memory cell (126, 130, 140, 146, 148, 258) includes a bottom electrode 126, a magnetic tunnel junction structure (140, 146, 148), and a top electrode 158, and the metallic etch mask portion 159 overlies the top electrode. Referring to step 2320 and FIGS. 6-9, at least one dielectric etch stop layer (172, 174) may be deposited over the metallic etch mask portion 159. Referring to step 2330 and FIG. 9, a via-level dielectric layer 176 may be deposited over the at least one dielectric etch stop layer (172, 174). Referring to step 2340 and FIGS. 10 and 11, a via cavity 179 may be etched through the via-level dielectric layer 176. A top surface of the at least one dielectric etch stop layer (172, 174) is physically exposed underneath the via cavity 179. Referring to step 2350 and FIGS. 12-14, 18, 19, and 21, the via cavity 179 may be vertically extended by removing portions of the at least one dielectric etch stop layer (172, 174) and the metallic etch mask portion 159. Referring to step 2360 and FIGS. 16-17B, 20, and 22, a contact via structure 180 may be formed directly on a top surface of the top electrode 158 in the via cavity 179.

Figure 24:
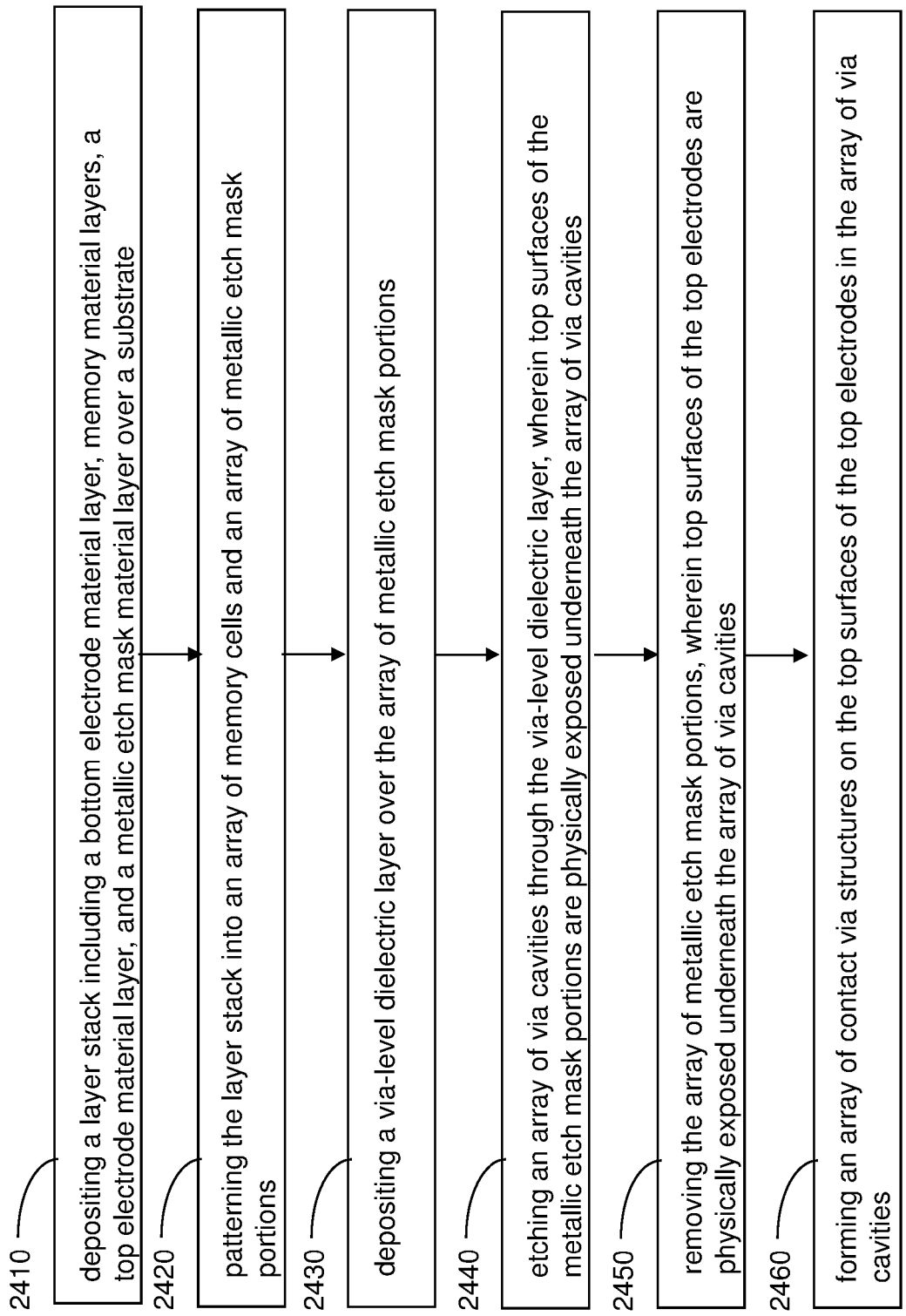
FIG. 24 is a second flowchart that illustrates the general processing steps of the methods of the present disclosure.

Referring to FIG. 24, a second flowchart illustrates the general processing steps of the methods of the present disclosure for forming a memory device. Referring to step 2410 and FIGS. 1-3, a layer stack including a bottom electrode material layer 126L, memory material layers (130L, 140L, 146L, 148L), a top electrode material layer 158L, and a metallic etch mask material layer 159L is formed over a substrate 9. Referring to step 2420 and FIGS. 4 and 5, the layer stack (126L, 130L, 140L, 146L, 148L, 158L, 159L) is patterned into an array of memory cells (126, 130, 140, 146, 148, 158) and an array of metallic etch mask portions 159. Each of the memory cells (126, 130, 140, 146, 148, 158) comprises a bottom electrode 126, a memory material stack (130, 140, 146, 148), and a top electrode 158. Each of the metallic etch mask portions 159 is a patterned portion of the metallic etch mask material layer 159L that overlies a respective one of the memory cells (126, 130, 140, 146, 148, 158). Referring to step 2430 and FIGS. 6-9, a via-level dielectric layer 176 is deposited over the array of metallic etch mask portions 159. Referring to step 2440 and FIGS. 10 and 11, an array of via cavities 179 is etched through the via-level dielectric layer 176. Top surfaces of the metallic etch mask portions 159 are physically exposed underneath the array of via cavities 179. Referring to step 2450 and FIGS. 12-14, 18, 19, and 21, the array of metallic etch mask portions 159 is removed. Top surfaces of the top electrodes 158 are physically exposed underneath the array of via cavities 179. Referring to step 2460 and FIGS. 16-17B, 20, and 22, an array of contact via structures 180 is formed on the top surfaces of the top electrodes 158 in the array of via cavities 179.

According to another aspect of the present disclosure, a method for forming a semiconductor device is provided, which comprises: forming a magnetic tunnel junction (MTJ) memory cell (126, 130, 140, 146, 148, 158) and a metallic etch mask portion 159 including a metallic nitride material over a substrate 9; sequentially forming a first dielectric etch stop layer 172, a second dielectric etch stop layer 174, a via-level dielectric layer 176, and a via-level metallic etch mask layer 178 over the metallic etch mask portion 159; forming a via cavity 179 by removing portions of the via-level metallic etch mask layer 178 and the via-level dielectric layer 176 using a first dry etching process; vertically extending the via cavity 179 by removing a portion of the second dielectric etch stop layer using a first wet etching process; vertically extending the via cavity 179 by removing a portion of the first dielectric etch stop layer 172 using a second dry etching process; and removing the metallic etch mask portion 159 using a second wet etching process.

Referring to all drawings and according to various embodiments of the present disclosure, a magnetic tunnel junction memory device is provided, which comprises: an array of magnetic tunnel junction (MTJ) memory cells (126, 130, 140, 146, 148, 158) located over a substrate 9, wherein each of the MTJ memory cells (126, 130, 140, 146, 148, 158) comprises a bottom electrode 126, a synthetic antiferromagnet structure 140, a nonmagnetic tunnel barrier layer 146, a free magnetization layer 148, and a top electrode 158; an array of dielectric spacers (162, 164), wherein each dielectric spacer (162, 164) selected from the array of dielectric spacers (162, 164) laterally surrounds and contacts a sidewall of a respective one of the MTJ memory cells (126, 130, 140, 146, 148, 158) and protrudes above a horizontal plane including topmost surfaces of the MTJ memory cells (126, 130, 140, 146, 148, 158) (i.e., above the top surface of the top electrodes 158); a memory-level dielectric layer 170 embedding the array of dielectric spacers (162, 164) and the array of MTJ memory cells (126, 130, 140, 146, 148, 158); a via-level dielectric layer 176 overlying the memory-level dielectric layer 170; and an array of contact via structures 180 embedded within the via-level dielectric layer 176, wherein each of the contact via structures 180 includes an upper portion embedded within the via-level dielectric layer 176 and a downward-protruding portion that contacts a sidewall of a respective one of the dielectric spacers (162, 164) and a top electrode 158 of a respective one of the MTJ memory cells (126, 130, 140, 146, 148, 158). In one embodiment, each of the contact via structures 180 may be formed as a unitary structure, i.e., a single continuously-extending structure. Each contact via structure 180 may consist of a metallic barrier layer 182 having a first metallic composition (such as a composition of a metallic nitride) and a metallic fill material portion 184 having a second metallic composition (such as a composition of an elemental metal or an intermetallic alloy).

In one embodiment, each contact via structure 180 within the array of contact via structures 180 comprises a horizontal surface that connects a vertical or tapered sidewall of the upper portion of the contact via structure 180 and a vertical or tapered sidewall of the downward-protruding portion of the contact via structure 180. In one embodiment, the upper portion has a greater lateral extent than the downward-protruding portion, and the horizontal surface comprises an annular bottom surface of the upper portion of a respective contact via structure 180 as illustrated in FIGS. 16, 17A, and 17B. In one embodiment, the upper portion has a lesser lateral extent than the downward-protruding portion, and the horizontal surface comprises an annular top surface of the downward-protruding portion of a respective contact via structure 180 as illustrated in FIG. 20.

In one embodiment, at least one dielectric etch stop layer (172, 174) may be located between the memory-level dielectric layer 170 and the via-level dielectric layer 176. The upper portion of each contact via structure 180 contacts a respective sidewall of the at least one dielectric etch stop layer (172, 174).

The various embodiments of the present disclosure may be used to reduce the contact resistance between a top electrode 158 and a contact via structure 180. The contact via structure 180 directly contacts a top surface of a top electrode 158. Thus, the contact resistance between the top electrode 158 and the contact via structure 180 may be minimized by incorporating the structure of the present disclosure to any memory cell including a top electrode 158 and underlying memory material layers. The at least one dielectric etch stop layer (172, 174) provides controlled selective etching of the metallic etch stop material portions 159 while minimizing collateral etching of the dielectric spacers (162, 164) and the memory-level dielectric layer 170.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a magnetic tunnel junction memory device, comprising:
    forming a magnetic tunnel junction (MTJ) memory cell and a metallic etch mask portion over a substrate, wherein the MTJ memory cell includes a bottom electrode, a magnetic tunnel junction structure, and a top electrode, and the metallic etch mask portion overlies the top electrode;
    forming a dielectric spacer around the MTJ memory cell and the metallic etch mask portion;
    forming a memory-level dielectric layer around the dielectric spacer;
    forming at least one dielectric etch stop layer over the metallic etch mask portion;
    forming a via-level dielectric layer over the at least one dielectric etch stop layer, wherein the via-level dielectric layer is formed over the memory-level dielectric layer;
    forming a via cavity through the via-level dielectric layer, wherein a top surface of the at least one dielectric etch stop layer is physically exposed;

vertically extending the via cavity by removing portions of the at least one dielectric etch stop layer and the metallic etch mask portion; and forming a contact via structure directly on a top surface of the top electrode in the via cavity.

2. The method of claim 1, wherein:
the dielectric spacer is formed directly on, and around, a sidewall of the metallic etch mask portion; and
removal of the metallic etch mask portion is performed selective to the dielectric spacer and the memory-level dielectric layer.

3. The method of claim 1, wherein:
the metallic etch mask portion comprises a conductive metallic nitride material; and
removal of the metallic etch mask portion is performed using a wet etch process that removes the conductive metallic nitride material.

4. The method of claim 1, wherein forming the magnetic tunnel junction (MTJ) memory cell and the metallic etch mask portion further comprises:
depositing a layer stack including a bottom electrode material layer, magnetic tunnel junction layers, a top electrode material layer, and a metallic etch mask material layer over a substrate;
applying and patterning a photoresist layer over the layer stack; and
etching the metallic etch mask material layer by performing a first anisotropic etch process that uses the photoresist layer as an etch mask, wherein a patterned portion of the metallic etch mask material layer comprises the metallic etch mask portion.

5. The method of claim 4, wherein forming the magnetic tunnel junction (MTJ) memory cell and the metallic etch mask portion further comprises performing a second anisotropic etch process that etches portions of the layer stack that are not masked by the metallic etch mask portion, wherein the metallic etch mask portion is used as an etch mask for the second anisotropic etch process at least during patterning of the bottom electrode material layer.

6. The method of claim 1, wherein:
the method comprises forming a memory-level dielectric layer around the MTJ memory cell and the metallic etch mask portion, wherein the via-level dielectric layer is formed above the memory-level dielectric layer;
the via cavity as formed through the via-level dielectric layer has a greater lateral extent than a lateral extent of the metallic etch mask portion; and
the metallic etch mask portion is removed by performing a selective etch process that etches the metallic etch mask portion selective to the via-level dielectric layer and the memory-level dielectric layer.

7. The method of claim 1, wherein:
the via cavity as formed through the via-level dielectric layer has a lesser lateral extent than a lateral extent of the metallic etch mask portion;
the metallic etch mask portion is removed by performing a selective etch process that etches the metallic etch mask portion selective to the via-level dielectric layer; and
the contact via structure is formed by depositing at least one conductive material in the via cavity.

8. The method of claim 1, further comprising:
forming a via-level metallic etch mask layer over the via-level dielectric layer;
patterning an opening through the via-level metallic etch mask layer;

etching a portion of the via-level dielectric layer located within the opening through the via-level metallic etch mask layer, wherein the via cavity is formed underneath the opening through the via-level metallic etch mask layer; and
simultaneously removing the via-level metallic etch mask layer and the metallic etch mask portion.

9. The method of claim 1, wherein:
the at least one dielectric etch stop layer comprises a first dielectric etch stop layer comprising silicon nitride and a second dielectric etch stop layer comprising a dielectric metal oxide material;
the via level dielectric layer comprises undoped silicate glass, a doped silicate glass, or organosilicate glass;
a first anisotropic etch process is performed to etch the via cavity through the via-level dielectric layer;
a wet etch process is performed to etch a portion of the second dielectric etch stop layer; and
a second anisotropic etch process is performed to etch a portion of the first dielectric etch stop layer.

10. A method of forming a magnetic tunnel junction memory device, comprising:
forming a magnetic tunnel junction (MTJ) memory cell and a metallic etch mask portion over a substrate, wherein the MTJ memory cell includes a bottom electrode, a magnetic tunnel junction structure, and a top electrode, and the metallic etch mask portion overlies the top electrode;
forming a memory-level dielectric layer around the MTJ memory cell and the metallic etch mask portion;
forming at least one dielectric etch stop layer over the memory-level dielectric layer and the metallic etch mask portion;
forming a via-level dielectric layer over the at least one dielectric etch stop layer;
forming a via cavity through the via-level dielectric layer and the at least one dielectric etch stop layer;
vertically extending the via cavity by removing the metallic etch mask portion; and
forming a contact via structure directly on a top surface of the top electrode in the via cavity,
wherein a bottom portion of via cavity has a width that is less than a width of a top surface of the metallic etch mask portion upon formation of the via cavity through the via-level dielectric layer and the at least one dielectric etch stop layer; and
the vertically-extended via cavity has a feature that is selected from:
a first feature that the vertically-extended via cavity comprises an undercut region that underlies an overhanging portion of the via-level dielectric layer and the at least one dielectric etch stop layer; and
a second feature that the vertically-extending via cavity has a stepped vertical cross-sectional profile in which a portion that underlies a horizontal plane including a top surface of the memory-level dielectric layer has a lesser width than a portion that overlies the horizonal plane.

11. The method of claim 10, wherein the vertically-extended via cavity has the first feature.

12. The method of claim 10, wherein the vertically-extended via cavity has the second feature.

13. The method of claim 10, wherein an entirety of the metallic etch mask portion is removed upon vertically extending the via cavity.

14. The method of claim 10, further comprising:
forming a via-level etch mask layer including an opening therethrough over the via-level dielectric layer, wherein the via cavity is formed by anisotropically etching portions of the via-level dielectric layer and the at least one dielectric etch stop layer that underlie the opening; and removing the via-level etch mask layer and the metallic etch mask portion simultaneously by performing an etch process.

15. The method of claim 14, wherein the etch process comprises a selective etch process that removes materials of the via-level etch mask layer and the metallic etch mask portion selective to the materials of the top electrode, the memory-level dielectric layer, and the via-level dielectric layer.

16. A method of forming a magnetic tunnel junction memory device, comprising:
forming a magnetic tunnel junction (MTJ) memory cell and a metallic etch mask portion over a substrate, wherein the MTJ memory cell includes a bottom electrode, a magnetic tunnel junction structure, and a top electrode, and the metallic etch mask portion overlies the top electrode;
forming a dielectric spacer around the MTJ memory cell and the metallic etch mask portion; and
forming a memory-level dielectric layer around the dielectric spacer, the MTJ memory cell and the metallic etch mask portion;
forming at least one dielectric etch stop layer over the memory-level dielectric layer and the metallic etch mask portion;
forming a via-level dielectric layer over the at least one dielectric etch stop layer;
forming a via cavity through the via-level dielectric layer and the at least one dielectric etch stop layer;
vertically extending the via cavity by performing a selective etch process that etches the metallic etch mask portion selective to materials of the via-level dielectric layer, the at least one dielectric etch stop layer, and the dielectric spacer; and
forming a contact via structure directly on a top surface of the top electrode in the via cavity.

17. The method of claim 16, wherein the selective etch process etches the metallic etch mask portion selective to a material of the top electrode.

18. The method of claim 16, further comprising:
forming a via-level etch mask layer including an opening therethrough over the via-level dielectric layer, wherein the via cavity is formed by anisotropically etching portions of the via-level dielectric layer and the at least one dielectric etch stop layer that underlie the opening; and
removing the via-level etch mask layer simultaneously with removal of the metallic etch mask portion during the selective etch process.

19. The method of claim 18, wherein:
the at least one dielectric etch stop layer is patterned prior to formation of the via-level dielectric layer to provide an area in which the via-level dielectric layer is formed directly on a top surface of the memory-level dielectric layer;
the via-level etch mask layer comprises an additional opening that overlies the area; and
an additional via cavity is formed through the via-level dielectric layer and the memory-level dielectric layer underneath the additional opening during formation of the via cavity through the via-level dielectric layer and the at least one dielectric etch stop layer.

20. The method of claim 10, further comprising forming a dielectric spacer around the MTJ memory cell and the metallic etch mask portion.

* * * * *